(12) United States Patent
Tsukamoto

(10) Patent No.: US 11,087,818 B2
(45) Date of Patent: Aug. 10, 2021

(54) SEMICONDUCTOR STORAGE ELEMENT, SEMICONDUCTOR STORAGE DEVICE, SEMICONDUCTOR SYSTEM, AND CONTROL METHOD

(71) Applicant: SONY SEMICONDUCTOR SOLUTIONS CORPORATION, Kanagawa (JP)

(72) Inventor: Masanori Tsukamoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 20 days.

(21) Appl. No.: 16/497,057

(22) PCT Filed: Feb. 19, 2018

(86) PCT No.: PCT/JP2018/005617
§ 371 (c)(1),
(2) Date: Sep. 24, 2019

(87) PCT Pub. No.: WO2018/186035
PCT Pub. Date: Oct. 11, 2018

(65) Prior Publication Data
US 2020/0381034 A1 Dec. 3, 2020

(30) Foreign Application Priority Data

Apr. 3, 2017 (JP) .............................. JP2017-073736

(51) Int. Cl.
*G11C 11/22* (2006.01)
*H01L 27/1159* (2017.01)

(52) U.S. Cl.
CPC ........ *G11C 11/2275* (2013.01); *G11C 11/223* (2013.01); *G11C 11/2273* (2013.01); *H01L 27/1159* (2013.01)

(58) Field of Classification Search
CPC .............. G11C 11/2275; G11C 11/223; G11C 11/2273; H01L 27/1159
See application file for complete search history.

(56) References Cited

U.S. PATENT DOCUMENTS

| | | |
|---|---|---|
| 5,345,414 A | 9/1994 | Nakamura |
| 5,446,688 A | 8/1995 | Torimaru |

(Continued)

FOREIGN PATENT DOCUMENTS

| | | |
|---|---|---|
| CN | 101000930 A | 7/2007 |
| EP | 0923135 A1 | 6/1999 |

(Continued)

OTHER PUBLICATIONS

Muller, et al., "Ferroelectric Hafnium Oxide: A CMOS-compatible and Highly Scalable Approach to Future Ferroelectric Memories" 2013 IEEE International Electron Devices Meeting, Dec. 9-11, 2013, pp. 10.8.1-10.8.4.

(Continued)

*Primary Examiner* — Tuan T Nguyen
(74) *Attorney, Agent, or Firm* — Chip Law Group

(57) ABSTRACT

Provided is a semiconductor storage element including a first transistor having a gate insulation film that includes a ferroelectric material at least partially and being a transistor to which information is written, and a second transistor that is coupled to, at one of a source and a drain, a source or drain of the first transistor. The first transistor has a threshold voltage smaller than 0 V when writing information and a threshold voltage smaller than 0 V when erasing information.

8 Claims, 19 Drawing Sheets

(56) References Cited

U.S. PATENT DOCUMENTS

| | | | |
|---|---|---|---|
| 5,737,261 A * | 4/1998 | Taira | G11C 11/22 |
| | | | 365/145 |
| 6,049,477 A | 4/2000 | Taira | |
| 6,144,579 A | 11/2000 | Taira | |
| 2007/0228432 A1 | 10/2007 | Ishihara et al. | |
| 2016/0027490 A1* | 1/2016 | Muller | H01L 29/78391 |
| | | | 365/145 |
| 2016/0111159 A1* | 4/2016 | Tandingan | G11C 11/419 |
| | | | 365/185.08 |
| 2018/0122478 A1* | 5/2018 | Morris | G11C 11/2273 |
| 2020/0303418 A1* | 9/2020 | Sakuma | H01L 29/516 |

FOREIGN PATENT DOCUMENTS

| | | |
|---|---|---|
| JP | 05-205487 A | 8/1993 |
| JP | 06-196647 A | 7/1994 |
| JP | 08-139286 A | 5/1996 |
| JP | 11-176958 A | 7/1999 |
| JP | 2001-229685 A | 8/2001 |
| JP | 2007-214532 A | 8/2007 |
| JP | 2009-230834 A | 10/2009 |
| JP | 2009-230835 A | 10/2009 |
| WO | 99/026252 A1 | 5/1999 |
| WO | 99/26252 A1 | 5/1999 |

OTHER PUBLICATIONS

International Search Report and Written Opinion of PCT Application No. PCT/JP2018/005617, dated Apr. 10, 2018,11 pages of ISRWO.

Muller, et al., "Ferroelectric Hafnium Oxide: A CMOS-compatible and Highly Scalable Approach to Future Ferroelectric Memories", International Electron Devices Meeting, IEEE, Jan. 30, 2014, 04 pages.

* cited by examiner

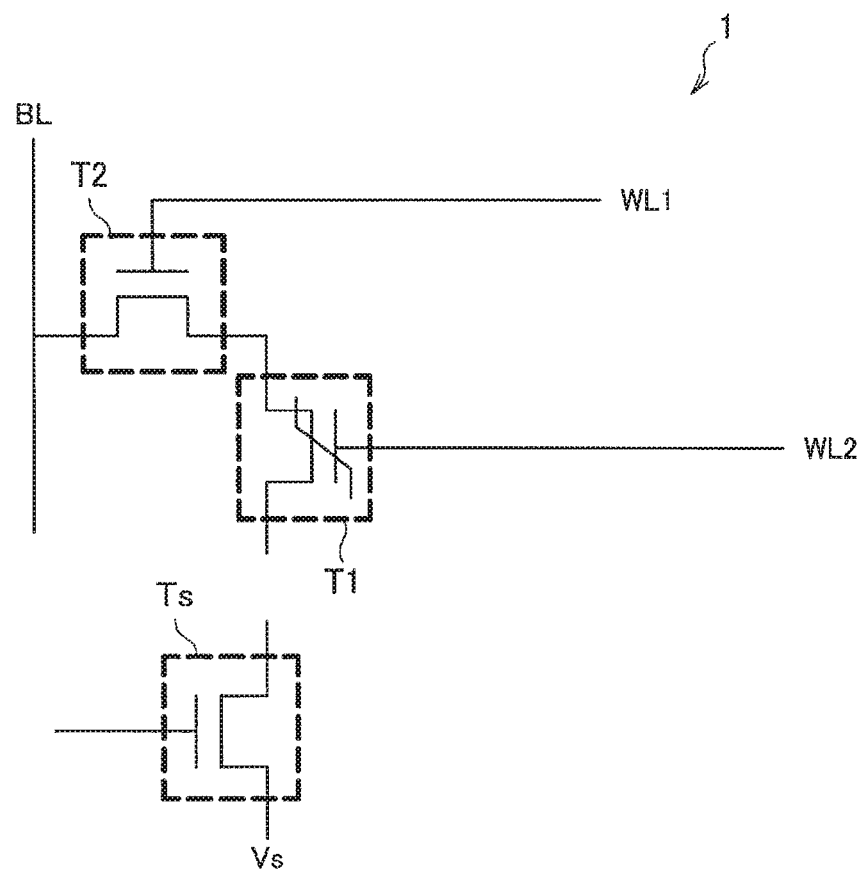
[FIG. 1]

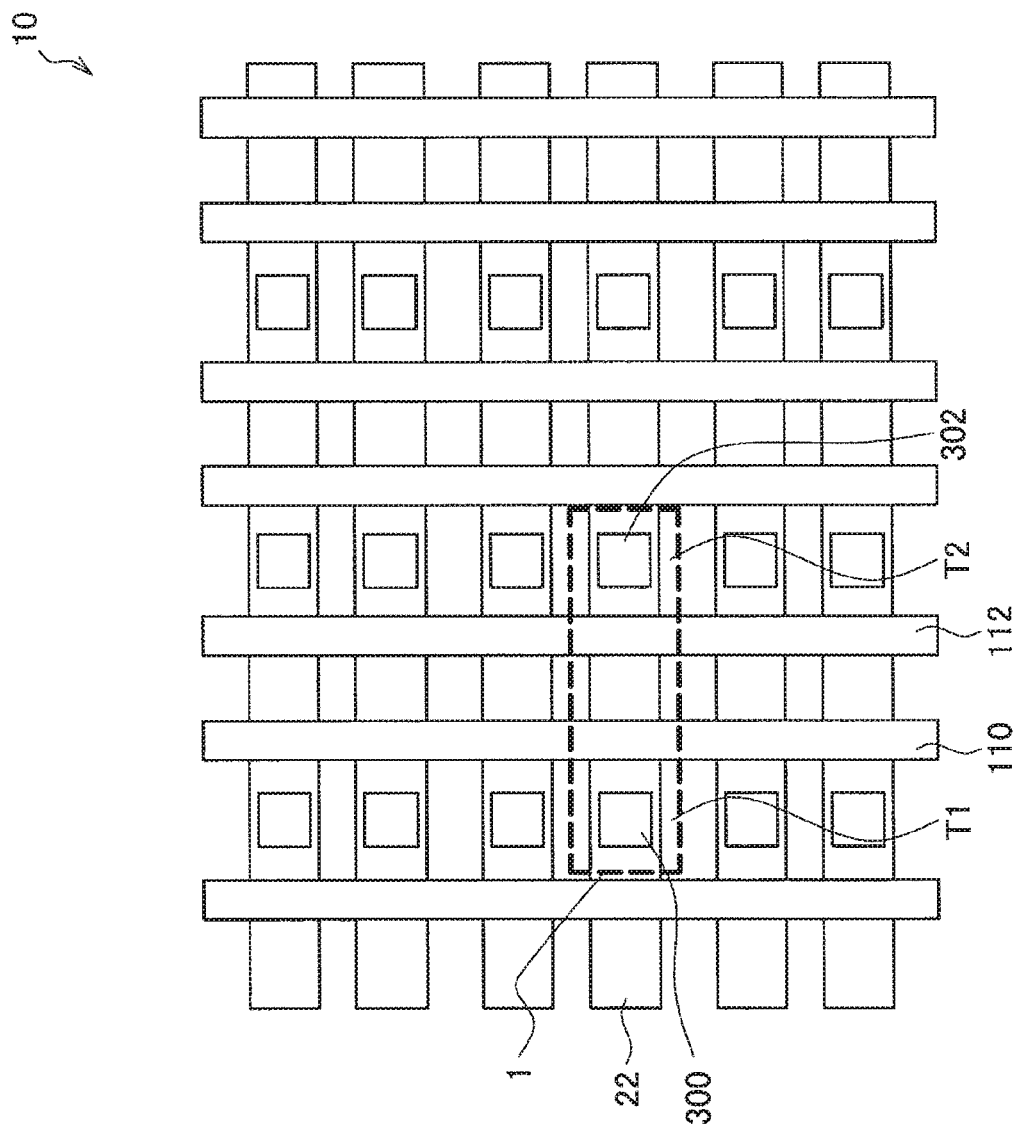
[FIG. 2]

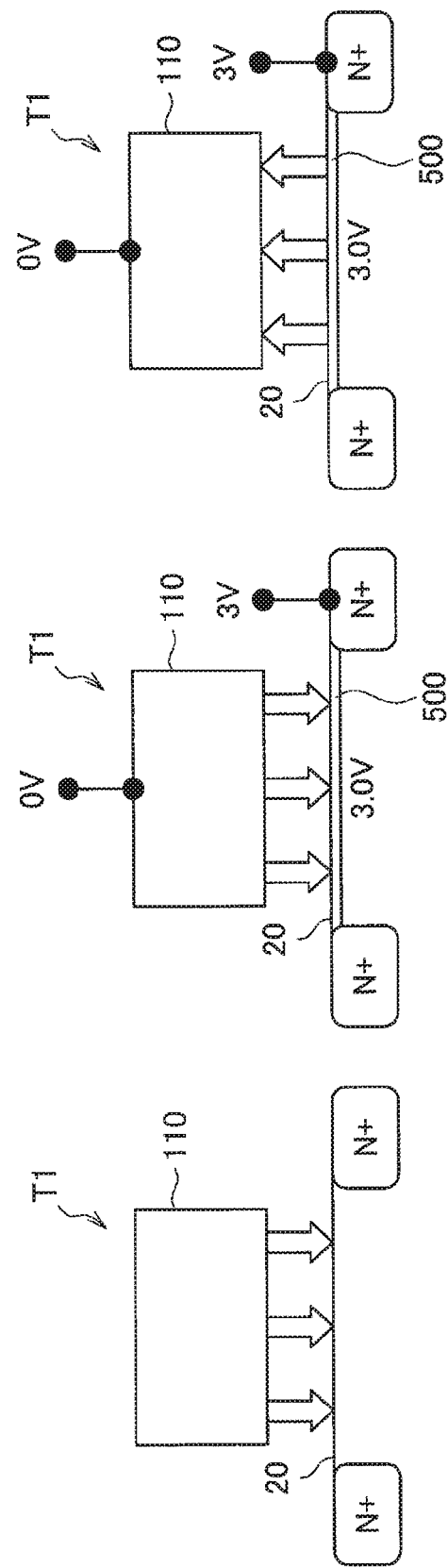
[FIG. 3]

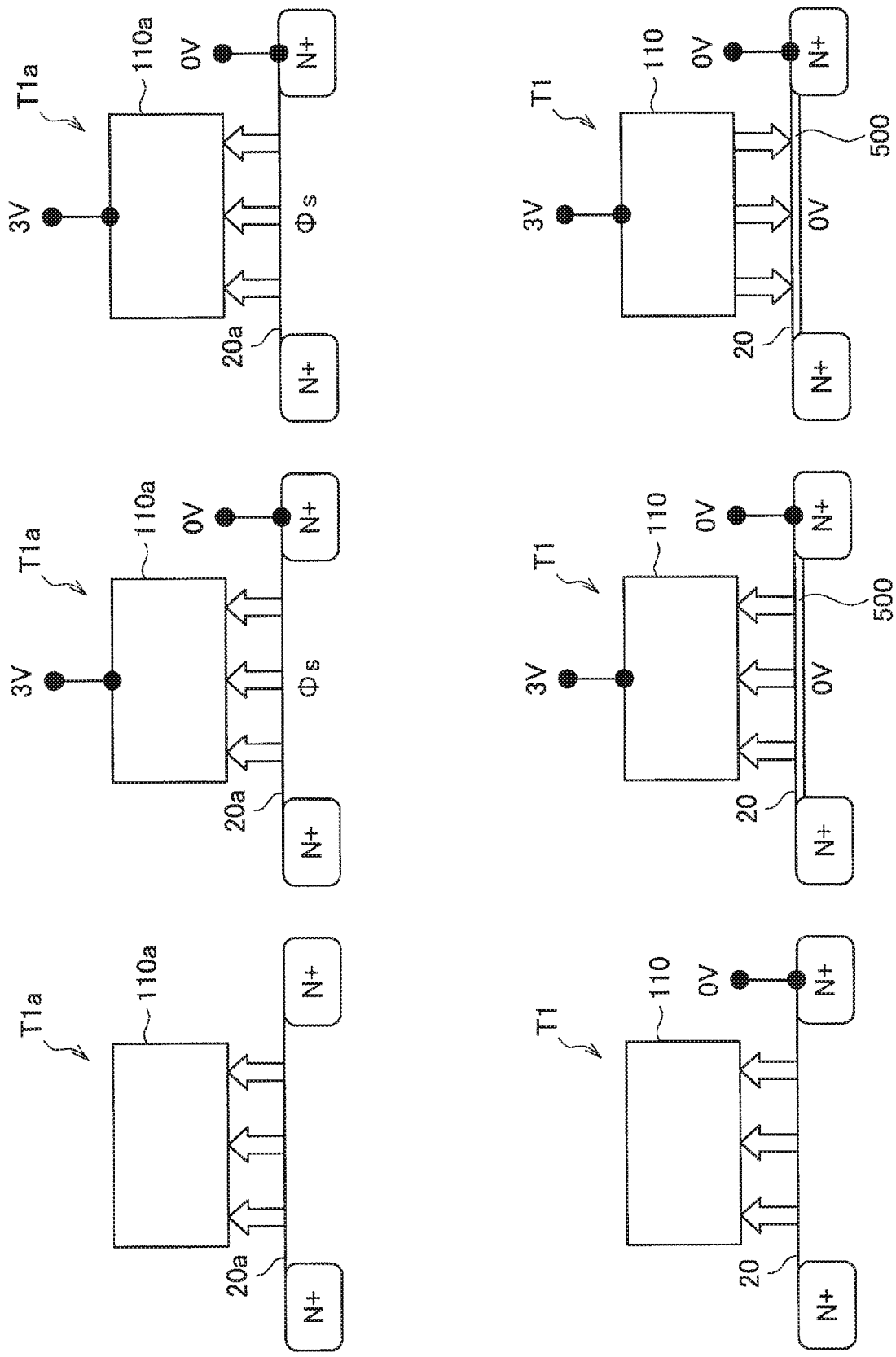
[FIG. 4]

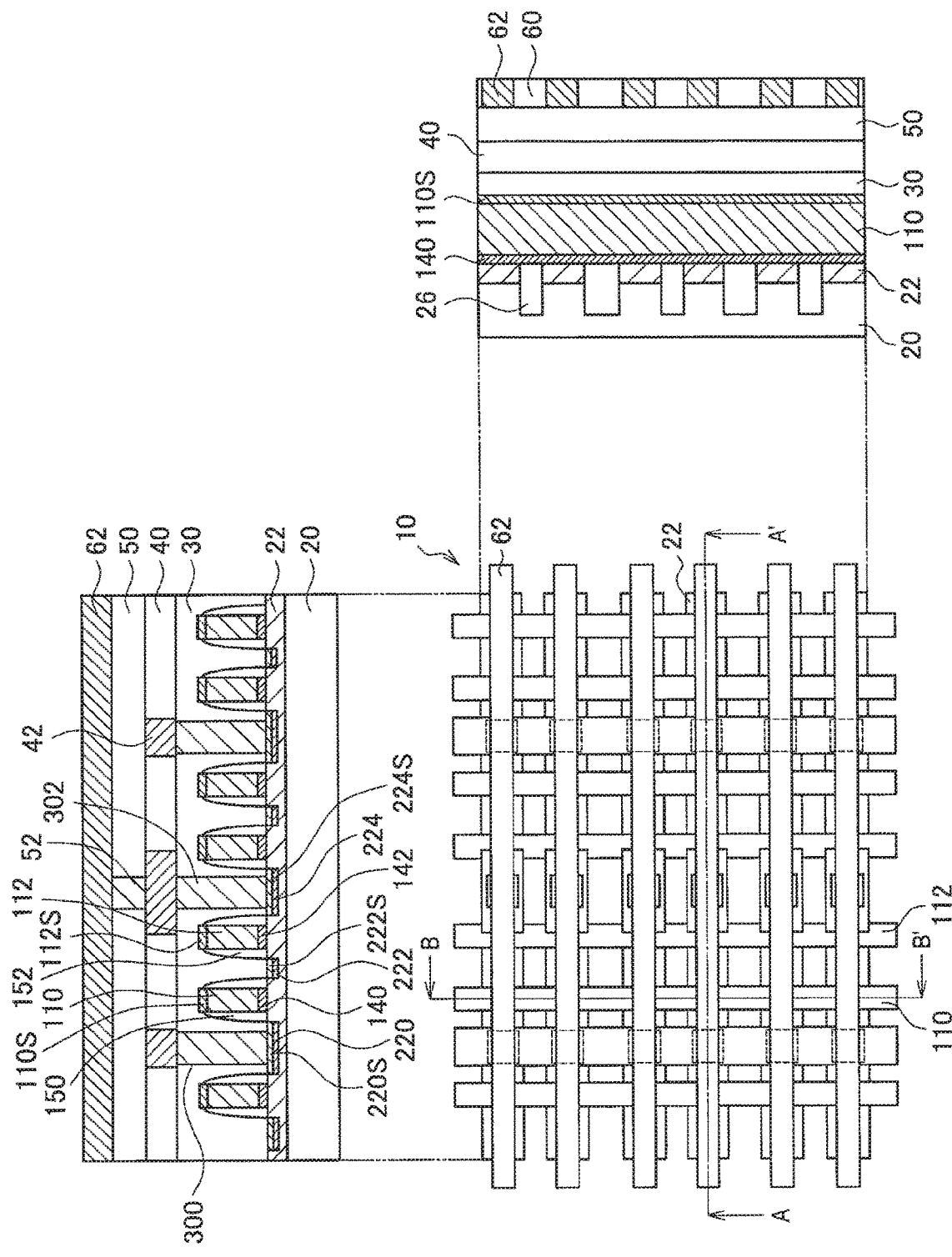
[FIG. 5]

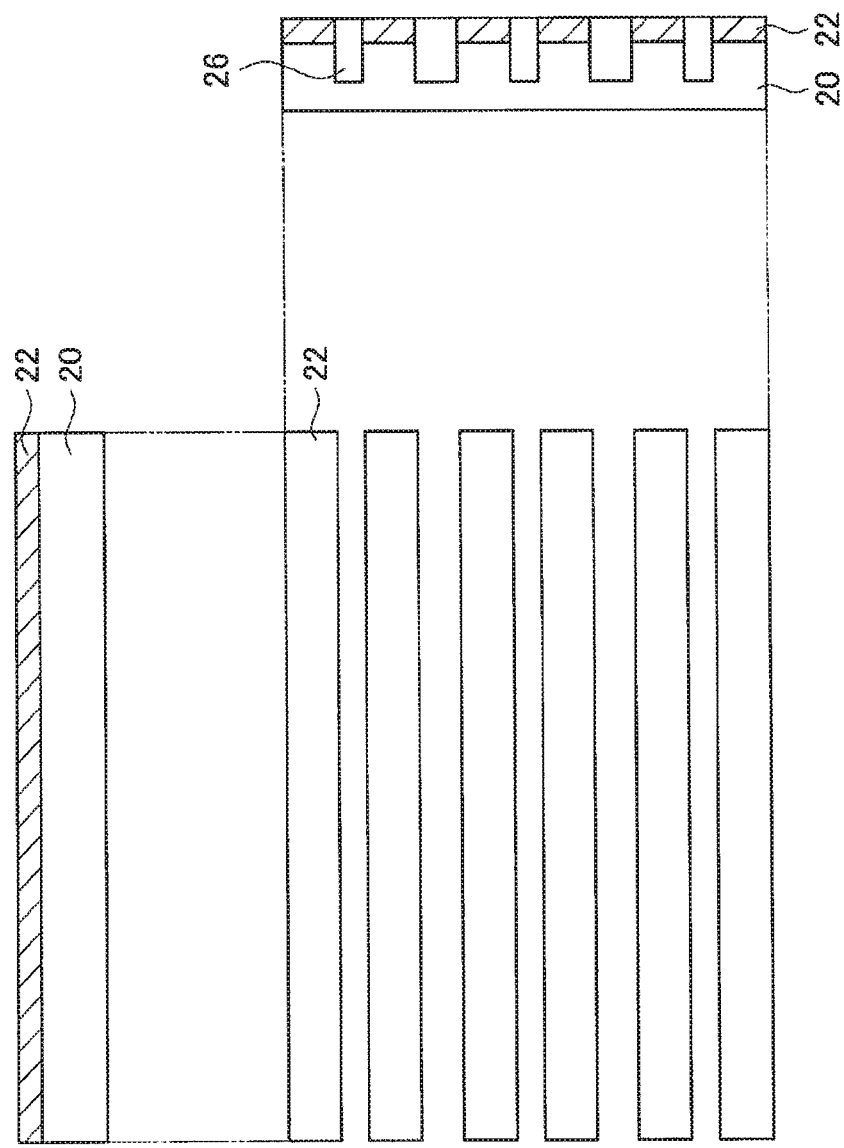
[FIG. 6]

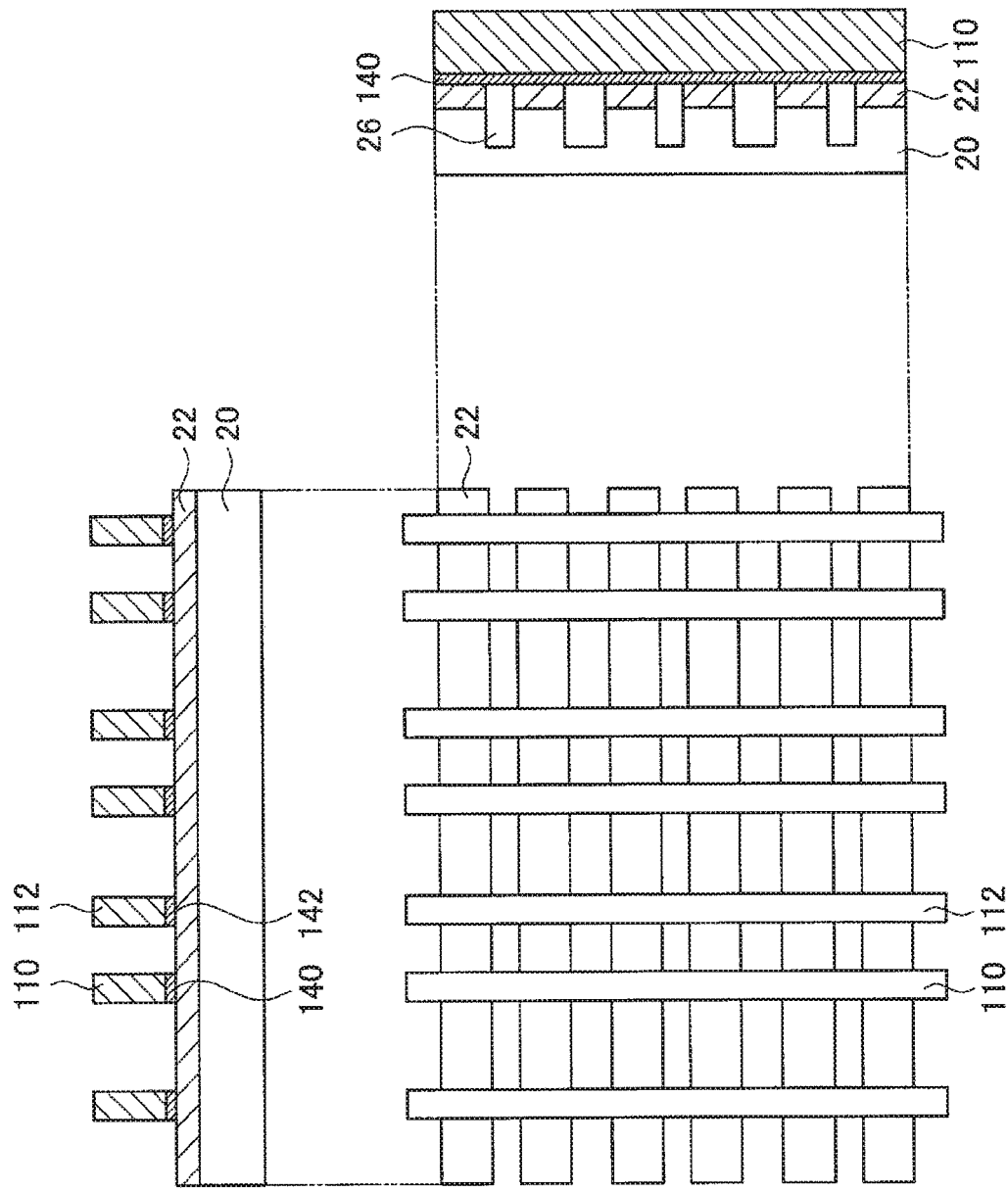
[FIG. 7]

[FIG. 8]
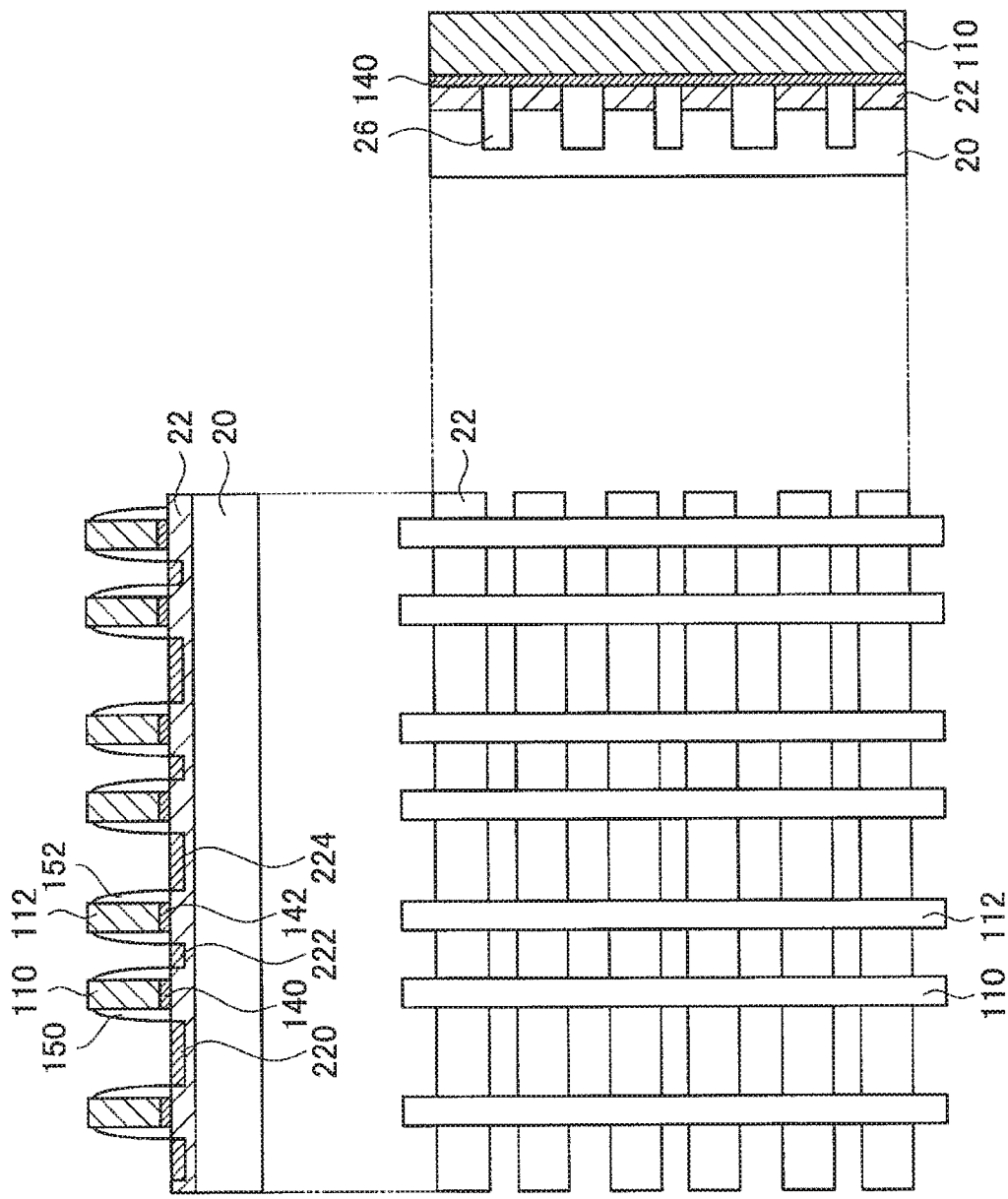

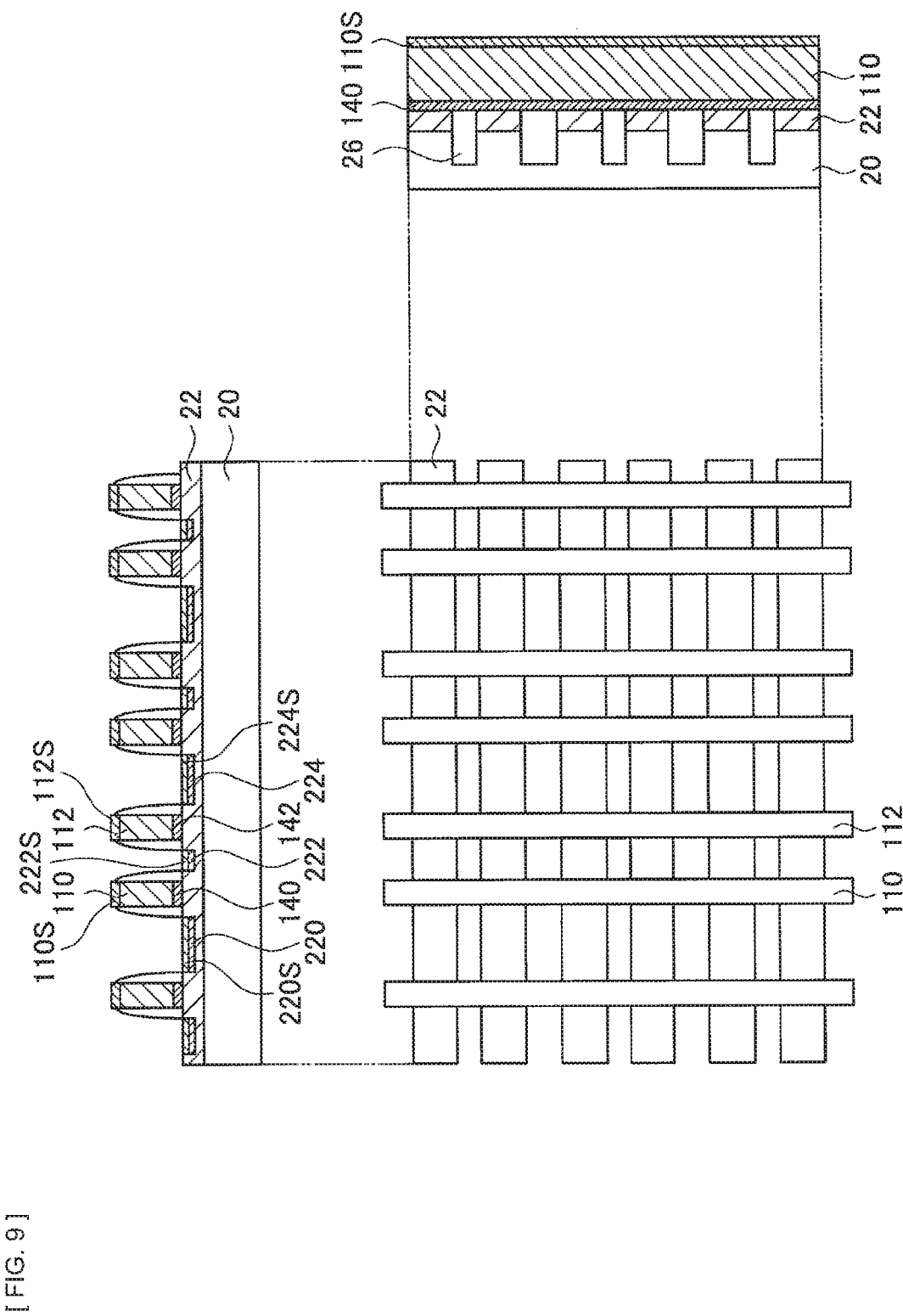
[FIG. 9]

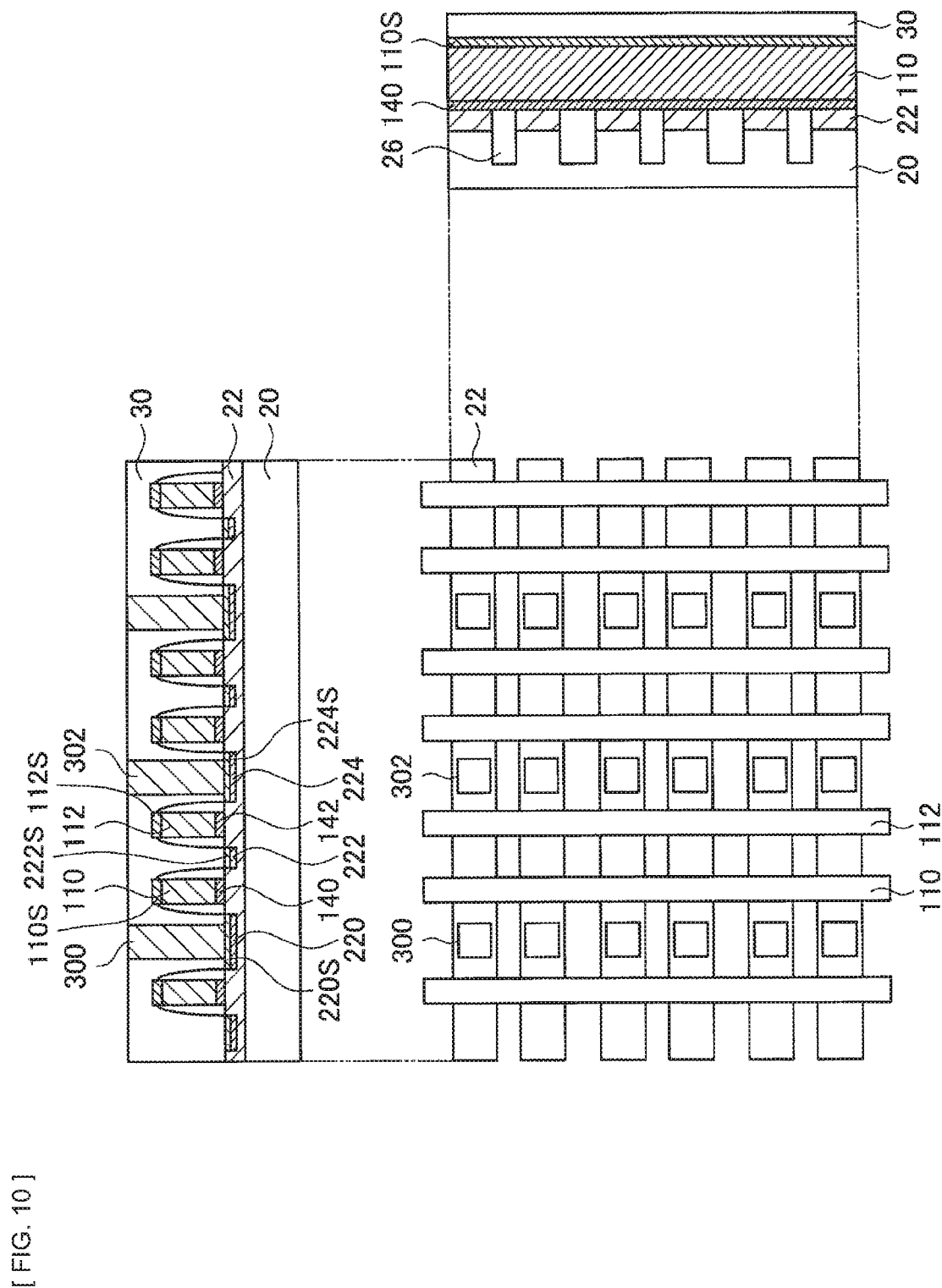
[FIG. 10]

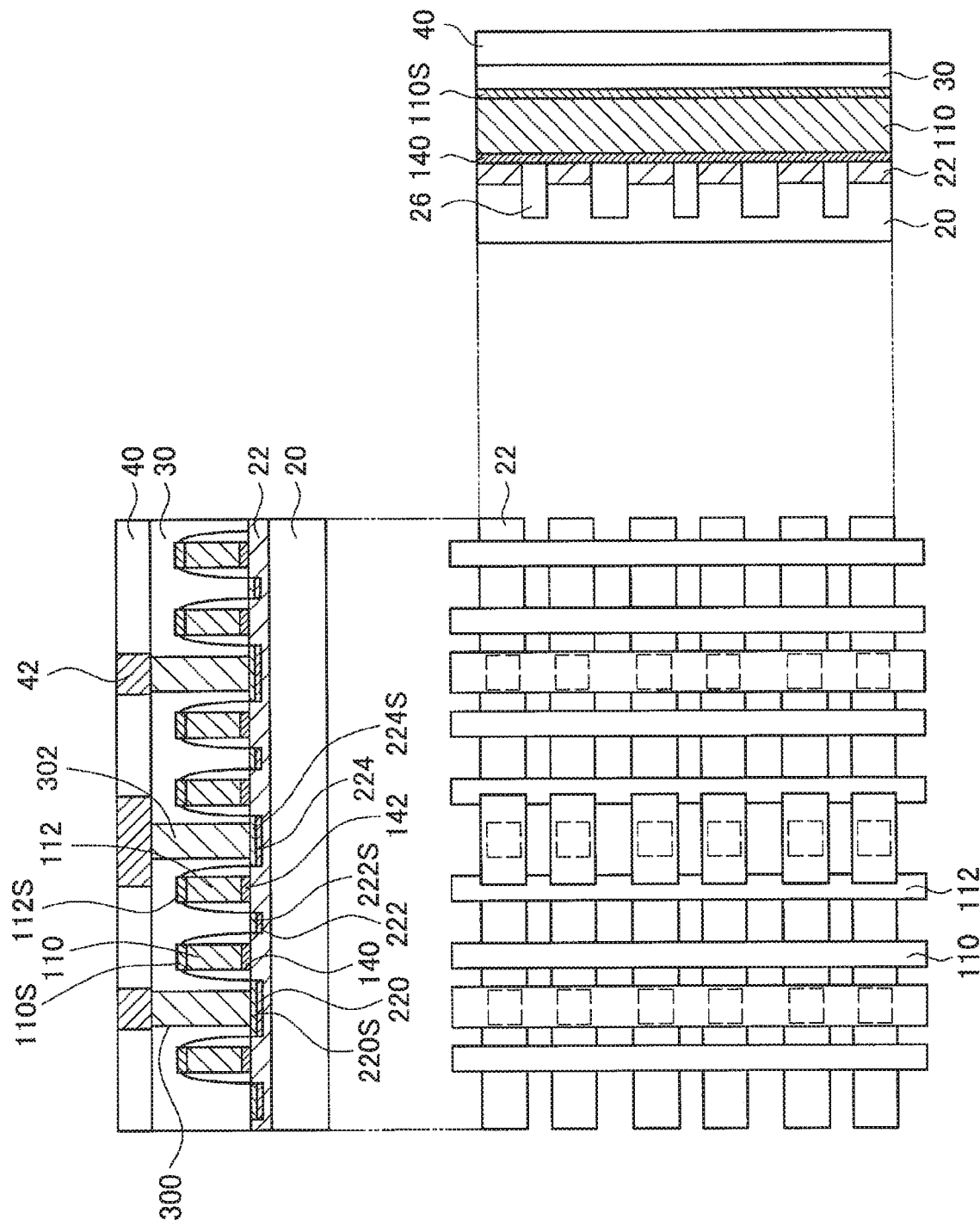
[FIG. 11]

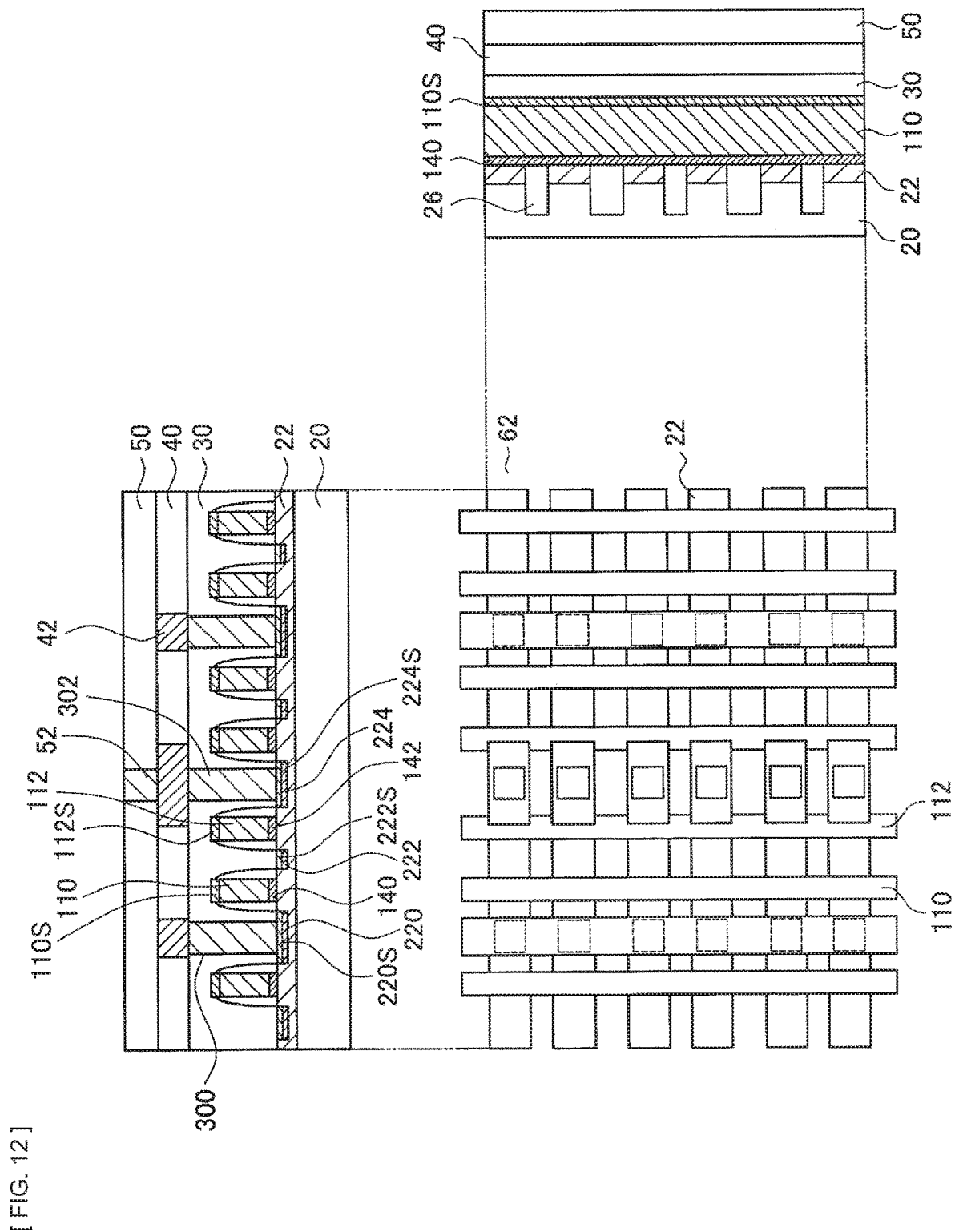
[ FIG. 12 ]

[FIG. 13]
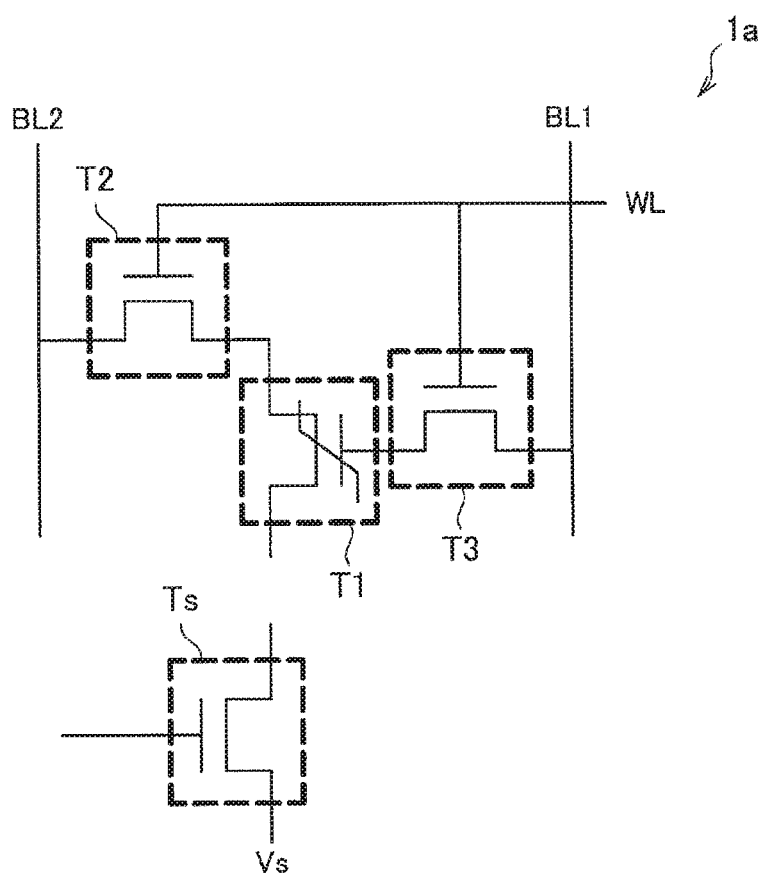

[FIG. 14]
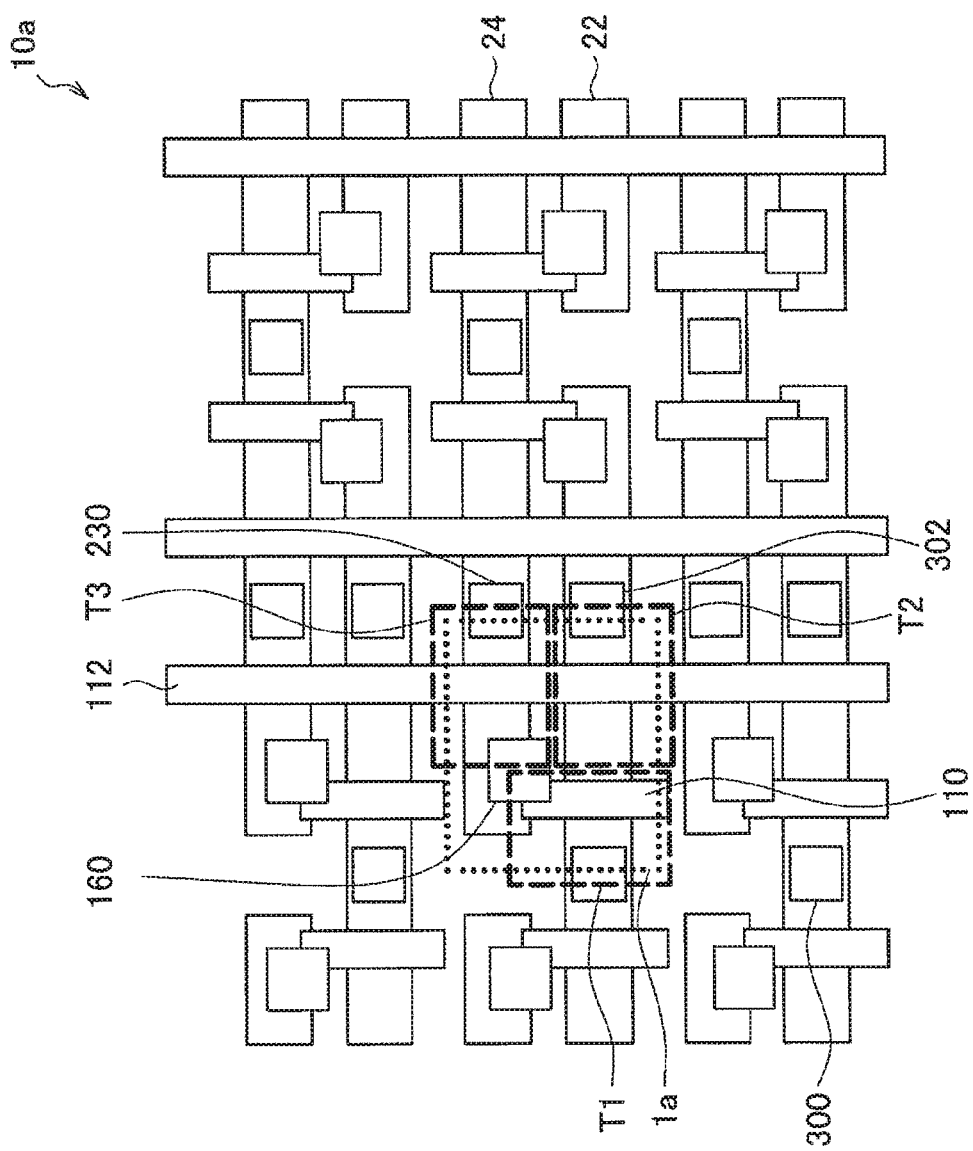

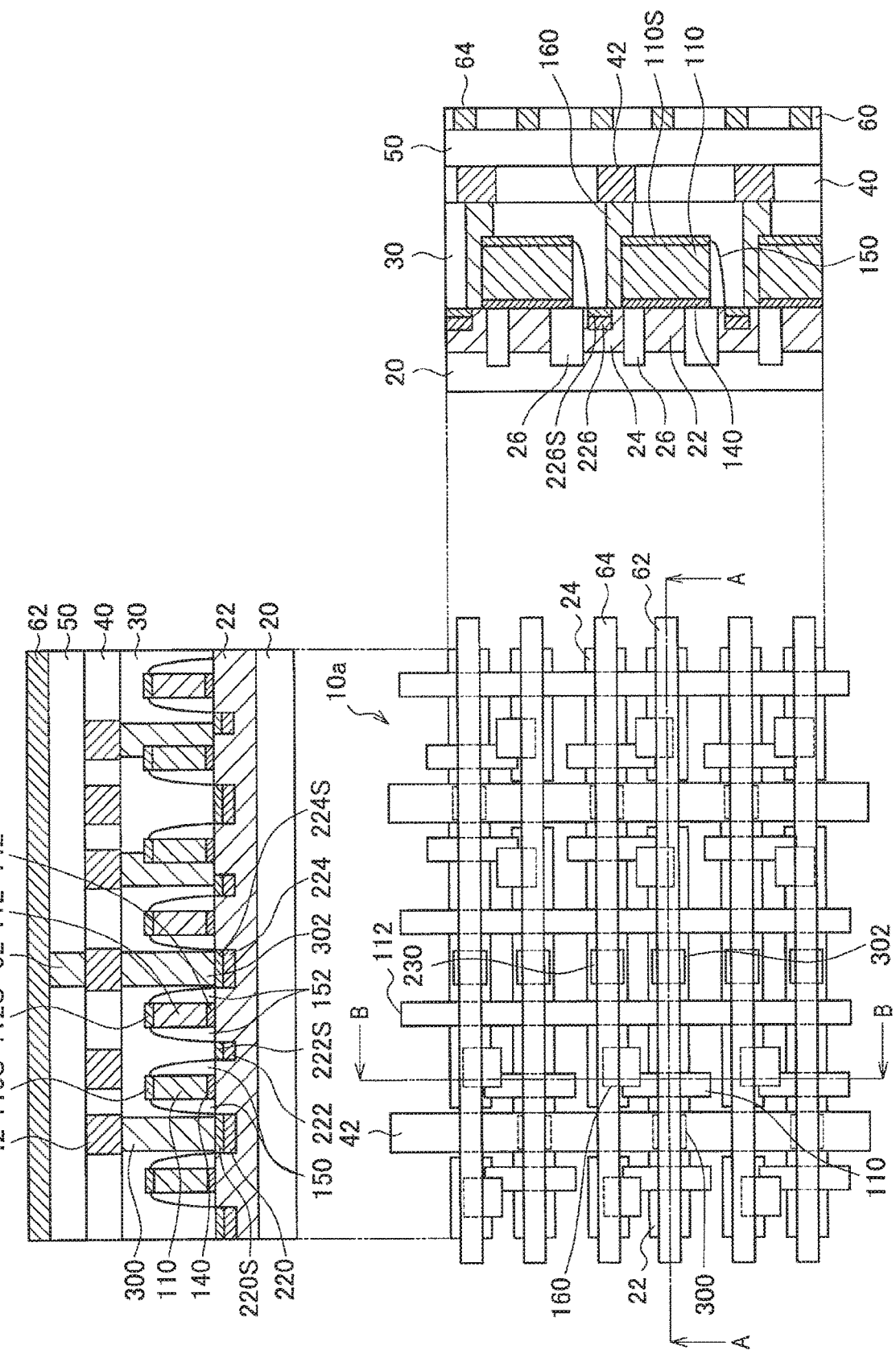
[FIG. 15]

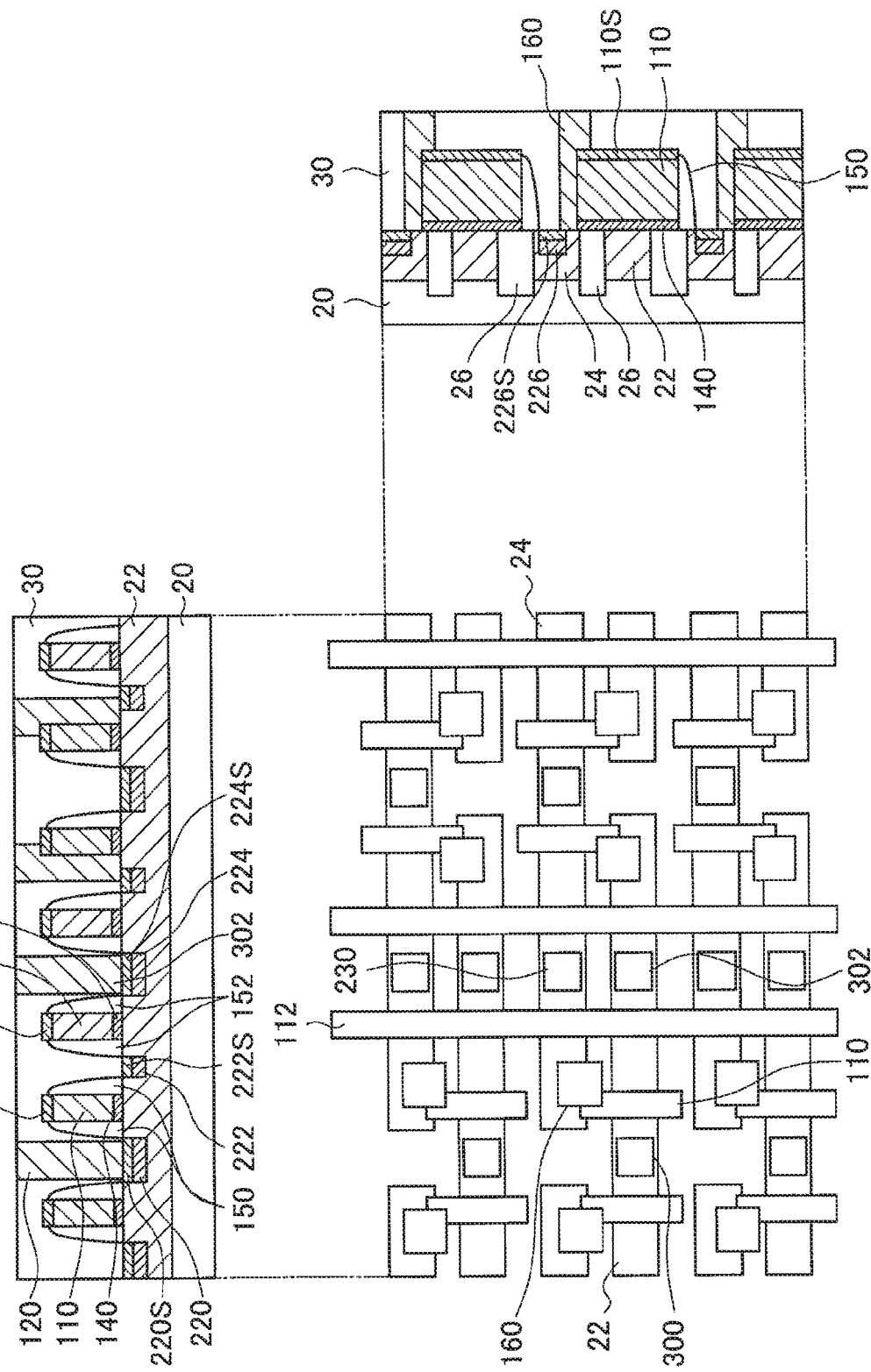

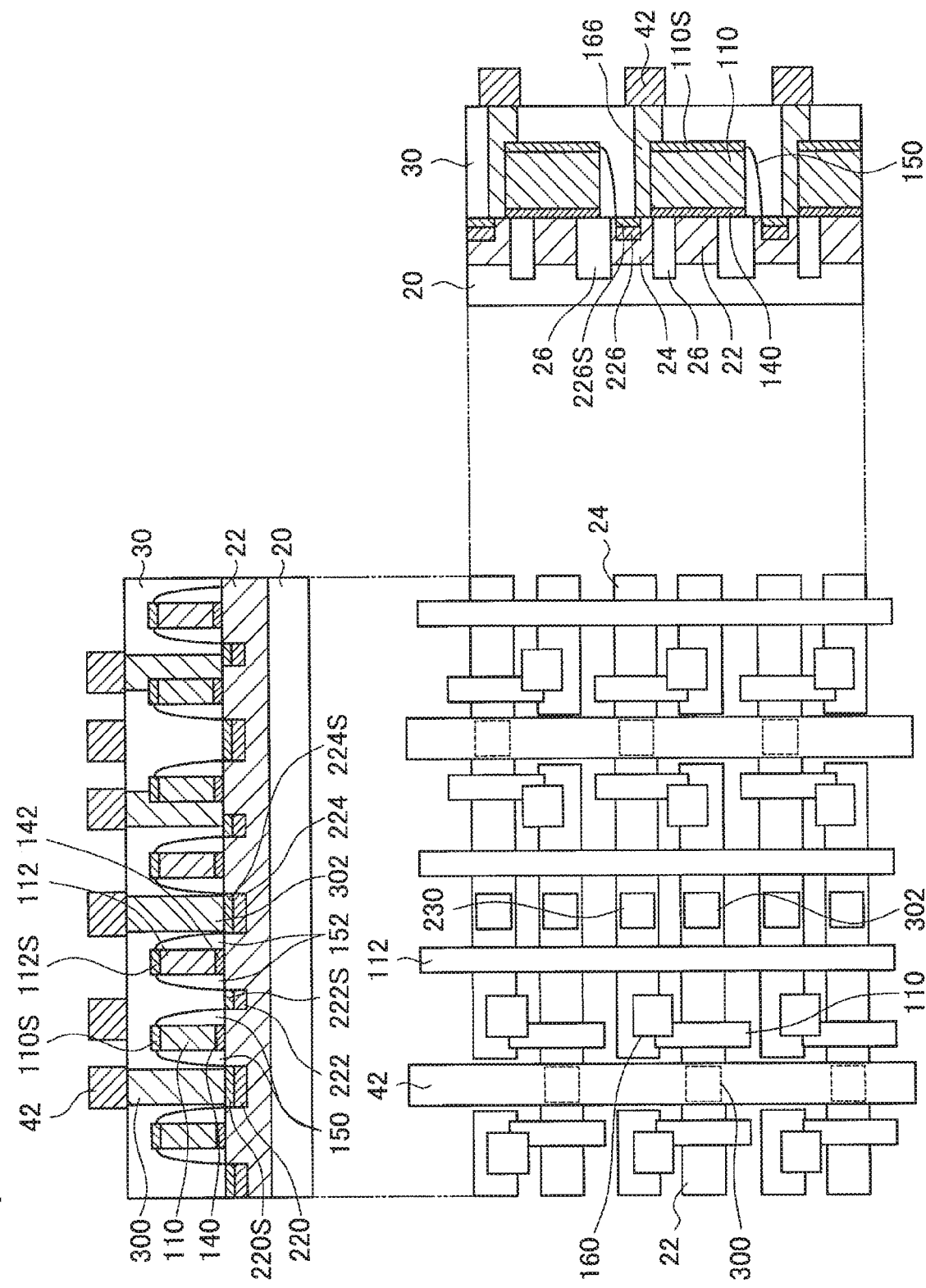
[FIG. 17]

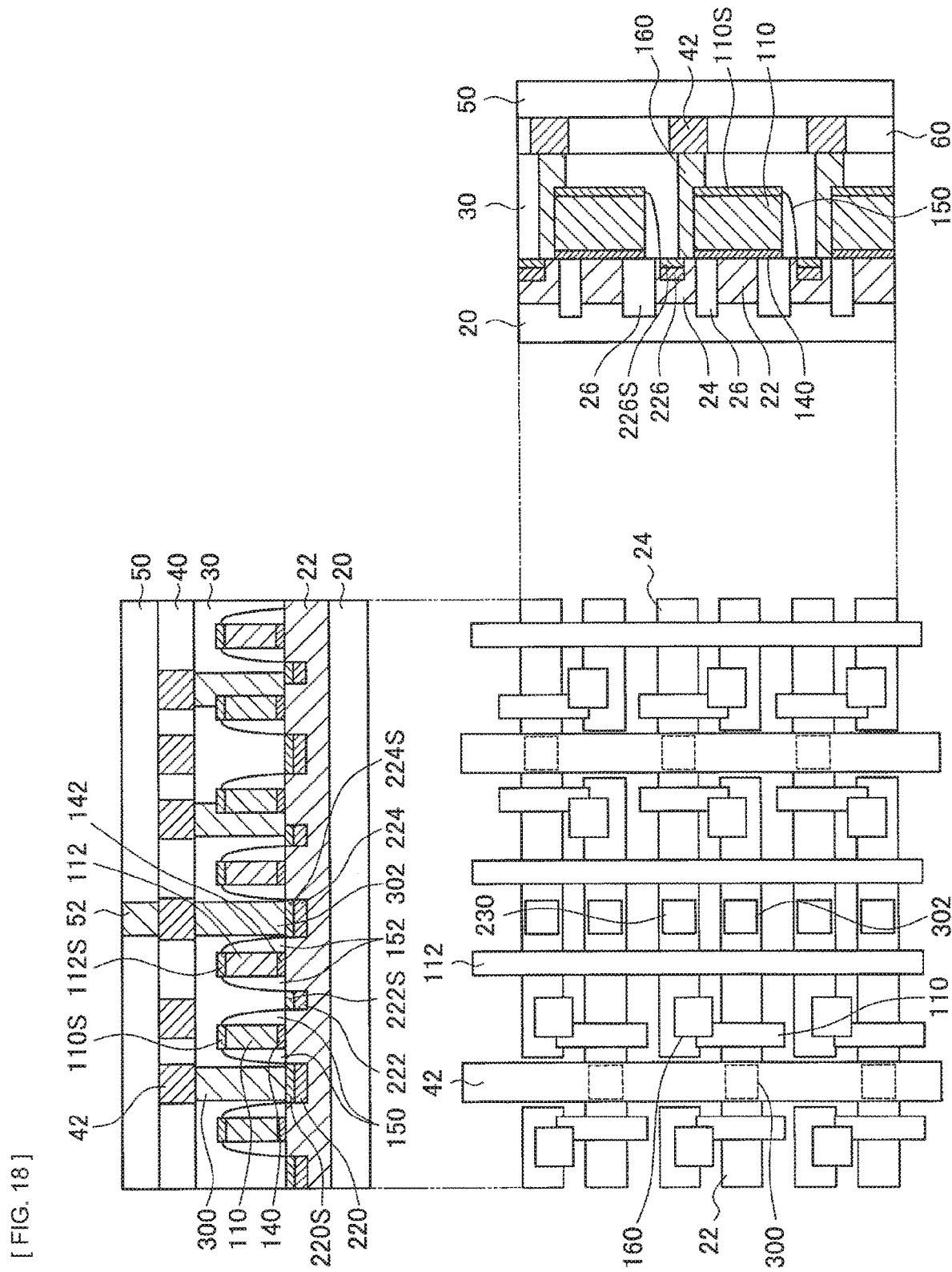
[FIG. 18]

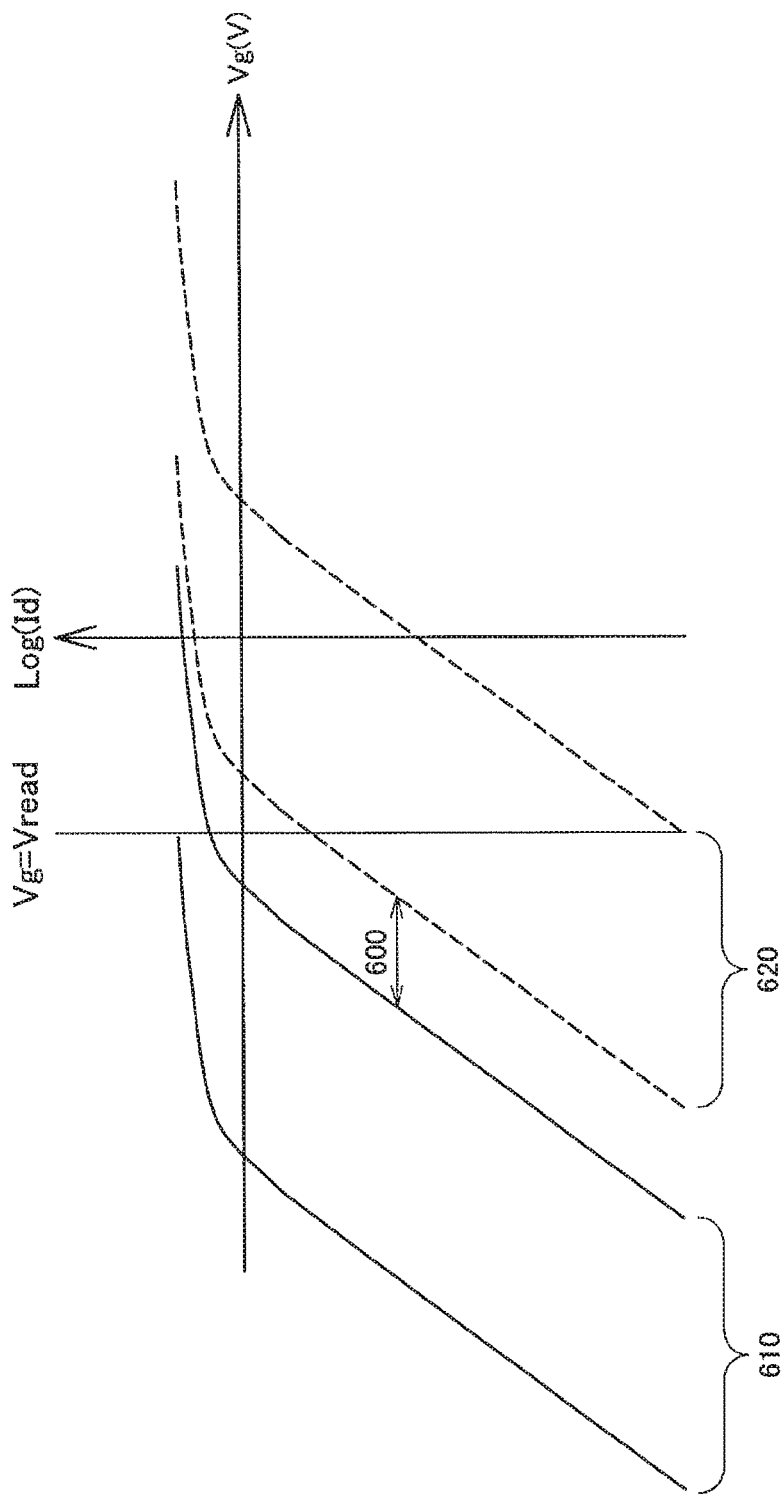

SEMICONDUCTOR STORAGE ELEMENT, SEMICONDUCTOR STORAGE DEVICE, SEMICONDUCTOR SYSTEM, AND CONTROL METHOD

CROSS REFERENCE TO RELATED APPLICATIONS

This application is a U.S. National Phase of International Patent Application No. PCT/JP2018/005617 filed on Feb. 19, 2018, which claims priority benefit of Japanese Patent Application No. JP 2017-073736 filed in the Japan Patent Office on Apr. 3, 2017. Each of the above-referenced applications is hereby incorporated herein by reference in its entirety.

TECHNICAL FIELD

The present disclosure relates to a semiconductor storage element, a semiconductor storage device, a semiconductor system, and a control method.

BACKGROUND ART

A CMOS (Complementary MOS) circuit in which an n-type MOSFET (metal-oxide-semiconductor field-effect transistor) and a p-type MOSFET are provided on the same substrate is widely used in many LSI (Large-Scale Integration) configuration devices for reasons of having low power consumption, and ease of miniaturization and high integration while enabling high-speed operation. In particular, an LSI in which the CMOS circuit, together with an analog circuit and memory, is mounted on one chip has been commercialized as a System-on-a-chip (SoC). So far, in the LSI as described above, a static random access memory (SRAM) has also been mounted as memory. However, in recent years, mixed mounting of various types of memory has been considered for the purpose of cost reduction and low power consumption.

For example, the following are being considered as alternatives to the SRAM: mounting a dynamic RAM (DRAM) that has already been put into practical use; and mounting a magnetic RAM (MRAM) or ferroelectric RAM (FeRAM) that allows high-speed writing/reading and has a sufficiently large number of rewriting times. In addition, it is possible to use these memories not only for mixed mounting as the SoC but also as a memory chip alone.

For example, the FeRAM includes a one-transistor one-capacitor (1T1C) type that uses a ferroelectric film as a capacitor, and a one-transistor (1T) type that uses a ferroelectric film as a gate insulation film.

In the 1T type, information is stored in one memory cell through a change in a threshold voltage (Vt) of a transistor, which is caused using a characteristic of a ferroelectric substance that changes a polarization direction in accordance with a direction of a gate voltage. In addition, in the 1T type, a memory cell functions as a "gain cell" that amplifies, by a transistor, a small change in electric charge caused by polarization. Such a 1T type includes a small number of elements in one memory cell and goes through a small number of processes, thus having an advantage as a low-cost technique.

However, in the 1T type, a plurality of memory cells shares a word line and a bit line. In a case of writing information to the memory cell, this results in a voltage being applied not only to a selected memory cell but also to an unselected memory cell sharing the word line and the bit line. Thus, there is a case where writing to the selected memory cell results in rewriting information stored in the unselected memory cell (write disturbance). The following PTLs 1 to 3 and NPTL 1 each disclose a technique that provides a measure against such write disturbance.

The following NPTL 1 and PTL 1 disclose that when writing information to a memory cell, a voltage Vdd is applied to a selected memory cell, and a voltage such as $\frac{1}{3}$ Vdd, $\frac{1}{2}$ Vdd, and $\frac{2}{3}$ Vdd is applied to an unselected memory cell. According to the technique disclosed in these patent literatures, while applying, only to a ferroelectric film in the selected memory cell, an invertible voltage that allows inverting a polarization direction, it is possible to suppress the voltage, which is applied to a ferroelectric film in the unselected memory cell, to below the invertible voltage. In this manner, it is possible to avoid occurrence of write disturbance.

In addition, the following PTLs 2 and 3 disclose providing, in a memory cell, an additional transistor that is coupled to a gate of a transistor having a ferroelectric film. According to a technique disclosed in these patent literatures, when writing information to a memory cell, it is possible to avoid occurrence of write disturbance by causing the additional transistor to prevent a voltage equal to or higher than the invertible voltage from being applied to the ferroelectric film in the unselected memory cell.

CITATION LIST

Patent Literature

PTL 1: WO No. 1999/26252
PTL 2: Japanese Unexamined Patent Application Publication No. 2009-230834
PTL 3: Japanese Unexamined Patent Application Publication No. H08-139286

Non-Patent Literature

NPTL 1: J. Muller et al., "Ferroelectric Hafnium Oxide: A CMOS-compatible and highly scalable approach to future ferroelectric memories" Tech. Dig. IEDM, p. 280 (2013)

SUMMARY OF THE INVENTION

Problem to be Solved by the Invention

In a technique disclosed in the foregoing patent literatures, shifting of a threshold voltage of a transistor having a ferroelectric film is caused by manufacturing variation in a memory cell and polarization of a ferroelectric film. This may cause, depending on a voltage applied, a ferroelectric film in a transistor to fail to polarize in a desired direction. In other words, in a memory cell in the foregoing technique, there is a case where it is difficult to perform stable writing of information.

Thus, the present disclosure suggests a semiconductor storage element, a semiconductor storage device, a semiconductor system, and a control method that are novel and improved, and make it possible to perform stable writing of information.

Means for Solving the Problem

According to the present disclosure, there is provided a semiconductor storage element including a first transistor that has a gate insulation film including at least partially a ferroelectric material and is a transistor to which information is written, and a second transistor that is coupled to, at one of a source and a drain, a source or a drain of the first transistor. The first transistor has a threshold voltage smaller than 0 V when writing information and a threshold voltage smaller than 0 V when erasing information.

In addition, according to the present disclosure, there is provided a semiconductor storage device, including a plurality of semiconductor storage elements arranged in a matrix. The plurality of semiconductor storage elements each includes a first transistor and a second transistor, the first transistor having a gate insulation film including at least partially a ferroelectric material and being a transistor to which information is written, the second transistor being coupled to, at one of a source and a drain, a source or a drain of the first transistor, the first transistor having a threshold voltage smaller than 0 V when writing information and a threshold voltage smaller than 0 V when erasing information.

In addition, according to the present disclosure, there is provided a semiconductor system, including a semiconductor storage device, and an arithmetic device that is coupled to the semiconductor storage device. The semiconductor storage device and the arithmetic device are mounted on one semiconductor chip. The semiconductor storage device includes a plurality of semiconductor storage elements arranged in a matrix, the plurality of semiconductor storage elements each including a first transistor and a second transistor, the first transistor having a gate insulation film including at least partially a ferroelectric material and being a transistor to which information is written, the second transistor being coupled to, at one of a source and a drain, a source or a drain of the first transistor, the first transistor having a threshold voltage smaller than 0 V when writing information and a threshold voltage smaller than 0 V when erasing information.

Furthermore, according to the present disclosure, there is provided a method of controlling a semiconductor element that is a method of controlling a semiconductor storage element that includes a transistor, the transistor having a gate insulation film that includes at least partially a ferroelectric material and being a transistor to which information is written, the method including controlling, when writing and when reading the information, a threshold voltage of the transistor by applying a voltage to a semiconductor substrate on which the semiconductor storage element is provided.

Effects of the Invention

As described above, according to the present disclosure, it is possible to provide a semiconductor storage element, a semiconductor storage device, a semiconductor system, and a control method that allow stable writing of information.

It is to be noted that the effects described above are not necessarily limitative, and in addition to or in place of the above effects, may have any of the effects described herein or any other effect that could be understood from the present description.

BRIEF DESCRIPTION OF DRAWINGS

FIG. 1 is a circuit diagram that illustrates a circuit configuration of a semiconductor storage element 1 according to a first embodiment of the present disclosure.

FIG. 2 is an explanatory diagram that schematically illustrates a planar structure of a semiconductor storage device 10 according to the embodiment.

FIG. 3 is an explanatory diagram that illustrates an erasing operation of the semiconductor storage element 1 according to the embodiment.

FIG. 4 is an explanatory diagram that illustrates a writing operation of the semiconductor storage element 1 according to the embodiment.

FIG. 5 is an explanatory diagram that illustrates a planar structure and a cross-sectional structure of the semiconductor storage device 10 according to the embodiment.

FIG. 6 is a plan view and a cross-sectional view (1) that describe a manufacturing process of the semiconductor storage device 10 according to the embodiment.

FIG. 7 is a plan view and a cross-sectional view (2) that describe a manufacturing process of the semiconductor storage device 10 according to the embodiment.

FIG. 8 is a plan view and a cross-sectional view (3) that describe a manufacturing process of the semiconductor storage device 10 according to the embodiment.

FIG. 9 is a plan view and a cross-sectional view (4) that describe a manufacturing process of the semiconductor storage device 10 according to the embodiment.

FIG. 10 is a plan view and a cross-sectional view (5) that describe a manufacturing process of the semiconductor storage device 10 according to the embodiment.

FIG. 11 is a plan view and a cross-sectional view (6) that describe a manufacturing process of the semiconductor storage device 10 according to the embodiment.

FIG. 12 is a plan view and a cross-sectional view (7) that describe a manufacturing process of the semiconductor storage device 10 according to the embodiment.

FIG. 13 is a circuit diagram that illustrates a circuit configuration of a semiconductor storage element 1a according to a second embodiment of the present disclosure.

FIG. 14 is an explanatory diagram that schematically illustrates a planar structure of a semiconductor storage device 10a according to the embodiment FIG. 15 is an explanatory diagram that illustrates a planar structure and a cross-sectional structure of the semiconductor storage device 10a according to the embodiment.

FIG. 16 is a plan view and a cross-sectional view (1) that describe a manufacturing process of the semiconductor storage device 10a according to the embodiment.

FIG. 17 is a plan view and a cross-sectional view (2) that describe a manufacturing process of the semiconductor storage device 10a according to the embodiment.

FIG. 18 is a plan view and a cross-sectional view (3) that describe a manufacturing process of the semiconductor storage device 10a according to the embodiment.

FIG. 19 is a graph illustrating a relationship between a gate voltage (Vg) and a drain current (Log(Id)) in the semiconductor storage element 1 according to an embodiment of the present disclosure.

MODES FOR CARRYING OUT THE INVENTION

In the following, some preferred embodiments of the present disclosure are described with reference to the attached drawings. It is to be noted that in the present description and drawings, the same reference numerals are assigned to components having substantially the same functional configurations, thereby omitting duplicate descriptions.

In addition, the drawings to be referred to in the following description are intended to describe an embodiment of the present disclosure and promote an understanding thereof, and in some cases, shapes, dimensions, ratios, etc. illustrated in the drawings are different from reality for better understanding. Furthermore, it is possible to change a design of a semiconductor storage element, etc. illustrated in the drawings where appropriate upon consideration of the following description and the known art. In addition, in the following description, a vertical direction of a stack structure of a semiconductor storage element and the like corresponds to a relative direction in a case of assuming a substrate surface on which the semiconductor storage element is provided as a top surface, and in some cases is different from a vertical direction in accordance with actual gravitational acceleration.

Furthermore, in the present description, when describing a circuit configuration, unless otherwise specified, "coupling" refers to electrical coupling among a plurality of elements. Furthermore, "coupling" in the following description includes not only a case of coupling a plurality of elements directly and electrically but also a case of coupling a plurality of elements indirectly and electrically via another element.

It is to be noted that in the present description, a "gate" represents a gate electrode of a field effect transistor. In addition, a "drain" represents a drain electrode or a drain region of the field effect transistor, and a "source" represents a source electrode or a source region of the field effect transistor. In addition, a "first conductivity type" represents one of a "p-type" and an "n-type", and a "second conductivity type" represents another of the "p-type" and the "n-type" that is different from the "first conductivity type".

It is to be noted that the descriptions are given in the following order.
1. First Embodiment
   1.1. Overview of Semiconductor Storage Element and Semiconductor Storage Device
   1.2. Operation of Semiconductor Storage Element
   1.3. Structure of Semiconductor Storage Device
   1.4. Method of Manufacturing Semiconductor Storage Device
2. Second Embodiment
   2.1. Overview of Semiconductor Storage Element and Semiconductor Storage Device
   2.2 Structure of Semiconductor Storage Device
   2.3 Method of Manufacturing Semiconductor Storage Device
3. Third Embodiment
   3.1. Writing Operation
   3.2 Reading Operation
4. Summary
5. Supplement Embodiments of the present disclosure described in the following relate to a semiconductor storage element. In detail, the present embodiments relate to a configuration and an operation of a nonvolatile memory using a metal-oxide-semiconductor field-effect transistor (MOSFET) having a gate insulation film that includes a ferroelectric material at least partially.

1. First Embodiment

[1.1. Overview of Semiconductor Storage Element and Semiconductor Storage Device]

First, an overview of a semiconductor storage element according to a first embodiment of the present disclosure is described with reference to FIGS. 1 and 2. FIG. 1 is a circuit diagram that illustrates a circuit configuration of a semiconductor storage element 1 according to the present embodiment. In addition, FIG. 2 is an explanatory diagram that schematically illustrates a planar structure of a semiconductor storage device 10 according to the present embodiment.

As illustrated in FIG. 1, the semiconductor storage element 1 according to the present embodiment includes a first transistor T1 and a second transistor T2 coupled to a drain of the first transistor T1. It is to be noted that the first transistor T1 has a source coupled to a power supply Vs via a selection transistor Ts that is provided outside the semiconductor storage element 1. In the following description, the first and second transistors T1 and T2 are transistors of the same conductivity type (for example, n-type transistors). However, in the present embodiment, this is not limitative, and the first and second transistors T1 and T2 may be transistors of conductivity types different from each other or may be p-type transistors.

The first transistor T1 is a field effect transistor having a gate electrode film that includes a ferroelectric material at least partially, and stores information in accordance with a direction of residual polarization of the gate electrode film. In other words, the semiconductor storage element 1 according to the present embodiment is a FeRAM having a 1T configuration that uses the first transistor T1 as a storage element. In addition, the first transistor T1 has a gate coupled to a second word line WL2, and on and off of a channel is controlled by a voltage applied from the second word line WL2.

Furthermore, in the first transistor T1 according to the present embodiment, the threshold voltage (Vt), which is a gate voltage allowing the first transistor T1 to turn on, is 0 V or less in any of writing and erasing states even in a case where variation occurs.

The second transistor T2 is a field effect transistor that is coupled to, at one of a source and a drain, a drain of the first transistor T1, and is coupled, at another of the source and the drain, to a bit line BL. In addition, the second transistor T2 has a gate coupled to a first word line WL1, and on and off of a channel is controlled by a voltage applied from the first word line WL1.

Furthermore, it is preferable that the second transistor T2 have a threshold voltage (Vt) that makes it possible to suppress a leakage current from the second transistor T2. For example, forming the second transistor T2 to have a higher threshold voltage makes it possible to suppress a leakage current. For example, it is preferable that the threshold voltage of the second transistor T2 be higher than a threshold voltage of the first transistor T1.

Thus, in the present embodiment, in a case of writing information to the semiconductor storage element 1, a voltage is applied to the first and second word lines WL1 and WL2, thus turning on the channels in the first and second transistors T1 and T2. In this manner, it is possible to control the direction of residual polarization of the gate insulation film in the first transistor T1 by external electric field, and to write information to the semiconductor storage element 1. It is to be noted that details of an operation at the time of writing information to the semiconductor storage element 1 according to the present embodiment is described later.

Subsequently, with reference to FIG. 2, described is a schematic structure of the semiconductor storage device 10 that includes a plurality of semiconductor storage elements 1 each having the circuit configuration illustrated in FIG. 1. As illustrated in FIG. 2, the semiconductor storage device 10 includes a large number of field effect transistors arranged in an array. Specifically, the semiconductor storage device 10 is provided in a region separated by a dashed line in FIG. 2, and the first and second transistors T1 and T2 are provided within the region.

The first transistor T1 is formed by providing a gate electrode 110 above an activation region 22 doped in the second conductivity type. In addition, each of the activation regions 22 sandwiching the gate electrode 110 is doped in the first conductivity type, to be included in a drain region and a source region of the first transistor T1.

The source region of the first transistor T1 is coupled to, via a contact plug 300, a selection transistor Va (not illustrated) and the power supply Vs (not illustrated) that are provided outside. The drain region of the first transistor T1 is coupled to one of source and drain regions of the second transistor T2, in the activation region 22 that is provided extendedly.

The second transistor T2 is formed by providing a gate electrode 112 above the activation region 22 doped in the second conductivity type. In addition, each of the activation regions 22 sandwiching the gate electrode 112 is doped in the first conductivity type, to be included in the drain region and the source region of the second transistor T2.

As described above, one of the source and drain regions of the second transistor T2 is coupled to the source region of the first transistor T1, in the activation region 22 that is provided extendedly. Meanwhile, another of the source and drain regions of the second transistor T2 is coupled to a bit line BL (not illustrated) via a contact plug 302.

For example, a plurality of semiconductor storage elements 1, each of which includes the first and second transistors as descried above, is arranged in a matrix on a semiconductor substrate, thus functioning as the semiconductor storage device 10 that stores various sets of information.

[1.2. Operation of Semiconductor Storage Element]

Next, operations of writing and erasing information by the semiconductor storage element 1 according to the present embodiment are described in detail. In the following description, an operation involving applying a positive voltage with respect to a substrate to the gate of the first transistor T1, and polarizing a film including a ferroelectric material (hereinafter, referred to as a ferroelectric film), which is included in the first transistor T1, is referred to as writing (program). Meanwhile, an operation involving applying a negative voltage with respect to the substrate to the gate of the first transistor T1, and polarizing the ferroelectric film in the first transistor T1 in a direction opposite to the foregoing direction is referred to as erasing (erase).

First, an erasing operation of the semiconductor storage element 1 according to the present embodiment is described with reference to FIG. 3. FIG. 3 describes the erasing operation of the semiconductor storage element 1 according to the present embodiment.

Here, the first transistor T1 in a writing state is caused to turn into an erasing state by the erasing operation. First, as illustrated on the left side of FIG. 3, the ferroelectric film in the first transistor T1 is in the writing state, thus having a downward residual polarization. Such a downward residual polarization is likely to induce a negative charge in a surface of a semiconductor substrate 20 below the gate electrode 110 of the first transistor T1, which is likely to form a channel (inversion layer) 500. Thus, the threshold voltage (Vt) of the first transistor T1 is in a low state.

Then, by the erasing operation, as illustrated in the middle of FIG. 3, for example, a voltage of 0 V is applied to the gate electrode 110 of the first transistor T1, and a voltage of 3 V is applied to the source/drain of the first transistor T1. In such a case, if the threshold voltage of the first transistor T1 in an initial state is sufficiently low, the channel 500 is formed in the surface of the semiconductor substrate 20 below the gate electrode 110 of the first transistor T1.

Furthermore, the channel 500 that is formed in the surface of the semiconductor substrate 20 is at the same potential as the source/drain of the first transistor T1, thus generating a voltage difference of 3 V between the surface of the semiconductor substrate 20 below the gate electrode 110 and the gate electrode 110. As illustrated on the right side of FIG. 3, this potential difference causes the ferroelectric film in the first transistor T1 to be polarized upward, thus turning into the erasing state.

Next, a writing operation of the semiconductor storage element 1 according to the present embodiment is described with reference to FIG. 4. FIG. 4 is an explanatory diagram that illustrates the writing operation of the semiconductor storage element 1 according to the present embodiment. In detail, a diagram in the upper row in FIG. 4 describes a writing operation of a semiconductor storage element according to a comparative example, and a diagram in the lower row in FIG. 4 describes the writing operation of the semiconductor storage element 1 according to the present embodiment. It is to be noted that the semiconductor storage element according to the comparative example has a circuit configuration and a structure similar to those of the semiconductor storage element according to the present embodiment as illustrated in FIGS. 1 and 2, but a first transistor T1a has a threshold voltage higher than the threshold voltage of the first transistor T1 according to the present embodiment.

Here, the first transistors T1 and T1a in the erasing state are caused to turn into the writing state by the writing operation. First, as illustrated on the upper left side and the lower left side of FIG. 4, the ferroelectric films in the first transistors T1 and T1a are in the erasing state, thus having an upward residual polarization. Such an upward residual polarization is less likely to induce a negative charge in the surface of the semiconductor substrates 20 and 20a below the gate electrodes 110 and 110a of the first transistors T1 and T1a, which is less likely to form the channel 500. Thus, this causes the first transistors T1 and T1a to each have a higher threshold voltage (Vt). In addition, there is also a case where microfabricating the semiconductor storage element 1 results in larger variations in the respective threshold voltages of the first transistors T1 and T2a, thus resulting in higher threshold voltages.

In such a state, by the writing operation, as illustrated in the upper middle and the lower middle of FIG. 4, for example, a voltage of 3 V is applied to the gate electrodes 110 and 110a of the first transistors T1 and T1a, and a voltage of 0 V is applied to the source/drain of the first transistors T1 and T1a. At this time, in the surface of the semiconductor substrate 20a below the gate electrode 110a of the first transistor T1a according to the comparative example, there is a case where the channel 500 is not formed due to a high threshold voltage (Vt). In this case, even if there is a potential difference of 3 V between the gate electrode 110a and the semiconductor substrate 20a, the channel 500 is not formed, thus generating a potential difference of only 3 V or less between the surface of the semiconductor substrate 20a below the gate electrode 110a and the gate electrode 110a. As a result, as illustrated on the upper right side of FIG. 4, there is a case where the small potential difference causes the ferroelectric film in the first transistor T1a according to the comparative example to be polarized downward, and does not turn into the writing state.

On the other hand, in the present embodiment, as described earlier, the first transistor T1 is formed to have a threshold voltage (Vt) of 0 V or less in any of the writing and the erasing states. Thus, as illustrated in the lower middle of FIG. 4, during the writing operation, the channel 500 is constantly formed in the surface of the semiconductor substrate 20 below the gate electrode 110 of the first transistor T1. Therefore, in a case of applying a voltage of 3 V to the gate electrode 110 of the first transistor T1 and applying a voltage of 0 V to the source/drain of the first transistor T1, the channel 500 is at the same potential as the source/drain of the first transistor T1, thus generating a potential difference of 3 V between the surface of the semiconductor substrate 20 below the gate electrode 110 and the gate electrode 110. Then, as illustrated on the lower right side of FIG. 4, this potential difference causes the ferroelectric film in the first transistor T1 to be polarized downward, thus turning into the writing state. It is to be noted that the channel 500 is formed in the surface of the semiconductor substrate 20 below the gate electrode 110 of the first transistor T1, thus making it possible to evenly apply a voltage to the ferroelectric film in the first transistor T1. As described above, in the semiconductor storage element 1 according to the present embodiment, it is possible to perform stable writing of information.

In addition, in the present embodiment, when reading information from the semiconductor storage element 1, a voltage is applied to the first and second word lines WL1 and WL2 illustrated in FIG. 1, to turn on the channels in the first and second transistors T1 and T2. Next, a current is caused to flow from the drain to the source of the first transistor T1 by turning on the channel in the selection transistor Vs and then applying a voltage to the bit line BL. In the first transistor T1, the threshold voltage (Vt) changes in accordance with the direction of the residual polarization of the ferroelectric film, thus making it possible to read information from the semiconductor storage element 1 by measuring the current flowing in the first transistor T1.

In the present embodiment, the first transistor T1 is formed to have a threshold voltage (Vt) of 0 V or less in any of the writing and the erasing states. Therefore, according to the present embodiment, when reading information, even if the voltage to be applied to the gate of the first transistor T1 is set low, a current is caused to flow in the first transistor T1, thus making it possible to read information. As a result, since a low voltage is applied when reading, it is possible to reduce stress that voltage application causes on the ferroelectric film in the first transistor T1, thus making it possible to increase reliability of the first transistor T1.

Furthermore, in the present embodiment, the threshold voltage of the second transistor T2 is set higher than the threshold voltage of the first transistor T1. Thus, it is possible to suppress a leakage current resulting from a low threshold voltage of the first transistor T1. In addition, when reading information, no voltage drop occurs for the threshold, thus making it possible to apply a desired voltage to the first transistor T1. As a result, according to the present embodiment, it is possible to read information from the first transistor T1 efficiently.

Meanwhile, in the foregoing PTL 2, when reading information, there is a case where noise is generated by a leakage current from a transistor in an unselected memory cell (semiconductor storage element) along the bit line. To read information accurately, it is required to secure a large difference (S/N ratio) between the noise resulting from the leakage current and a read current, but in the foregoing PTL 2, it is difficult to secure a large S/N ratio. However, in the present embodiment, the second transistor T2 is formed to have a threshold voltage (Vt) that makes it possible to suppress a leakage current from the second transistor T2. In this manner, when reading information from the semiconductor storage element 1, the leakage current from the second transistor T2 is small, thus making it possible to secure a large difference (S/N ratio) between the noise due to the leakage current and the read current.

[1.3. Structure of Semiconductor Storage Device]

Subsequently, a specific structure of the semiconductor storage device 10 according to the present embodiment is described with reference to FIG. 5. FIG. 5 is an explanatory diagram that illustrates a planar structure and a cross-sectional structure of the semiconductor storage device 10 according to the present embodiment. In detail, a plan view illustrating the planar structure of the semiconductor storage device 10 is illustrated on the lower left side of FIG. 5, a cross-sectional view taken along line A-A' in the plan view is illustrated on the upper left side, and a cross-sectional view taken along line B-B' in the plan view is illustrated on the lower right side.

As illustrated in FIG. 5, on the semiconductor substrate 20, activation regions 22 are provided in strips parallel to each other, and the gate electrodes 110 and 112 are provided above each activation region 22, thus forming the first and second transistors T1 and T2. In addition, the first transistor T1 has a gate, a source, and a drain each coupled to a corresponding one of wiring lines via the contact plug 300, and the second transistor T2 has a gate, a source, and a drain each coupled to a corresponding one of wiring lines via the contact plug 302, thus configuring the semiconductor storage element 1 having the circuit configuration illustrated in FIG. 1. Furthermore, a large number of semiconductor storage elements 1 like this are integrated in an array on the semiconductor substrate 20, thus configuring the semiconductor storage device 10.

The semiconductor substrate 20 is a support substrate on which the semiconductor storage element 1 and the semiconductor storage device 10 are formed. For the semiconductor substrate 20, a substrate including various types of semiconductors may be used, and for example, a substrate including polycrystalline, monocrystalline, or amorphous silicon (Si) may be used. In addition, the semiconductor substrate 20 may be an SOI (Silicon on Insulator) substrate that is a silicon substrate in which an insulation film such as $SiO_2$ is inserted.

The activation regions 22 are each a region of the second conductivity type, and provided in strips isolated from each other by an element isolation region 26. For example, the activation region 22 may be formed by introducing an impurity of the second conductivity type (for example, a p-type impurity such as boron (B)) into the semiconductor substrate 20. It is to be noted that the activation region 22 functions as a channel region in the first and second transistors T1 and T2.

The element isolation region 26 is a region having insulation property, and electrically isolates the transistors T1 and T2 on the activation region 22 from each other by electrically isolating the activation regions 22 from each other. Specifically, the element isolation region 26 may include oxynitride having insulation property such as silicon oxide ($SiO_x$) or silicon nitride ($SiN_x$). For example, the element isolation region 26 may be formed using an STI (Shallow Trench Isolation) method, by removing a portion of the semiconductor substrate 20 in a desired region by etching or the like, and then embedding silicon oxide ($SiO_x$) in an opening due to etching. In addition, the element isolation region 26 may be formed using a LOCOS (Local Oxidation of Silicon) method, by converting the semiconductor substrate 20 in a predetermined region into an oxide by thermal oxidization.

A first gate insulation film 140 is a gate insulation film in the first transistor T1, and is provided on the activation region 22. Since the first transistor T1 functions as a storage element that stores information, the first gate insulation film 140 includes, at least partially, a ferroelectric material that becomes polarized spontaneously and allows control of a polarization direction by external electric field. For example, the first gate insulation film 140 may include a ferroelectric material having a perovskite structure such as lead zirconate titanate ($Pb(Zr,Ti)O_3$: PZT) or strontium bismuth tantalite ($SrBi_2Ta_2O_9$: SBT). In addition, the first gate insulation film 140 may be a ferroelectric film obtained by converting, by heat processing or the like, a film including a high dielectric material such as $HfO_x$, $ZrO_x$, or $HfZrO_x$, or may be a ferroelectric film formed by doping an element such as lanthanum (La), silicon (Si), or gadolinium (Gd) in a film that includes the high dielectric material described above. In addition, the first gate insulation film 140 may include a plurality of layers. For example, the first gate insulation film 140 may include a film stack that includes a film including a ferroelectric material and an insulation film such as silicon oxide ($SiO_x$) or silicon nitride ($SiN_x$).

The gate electrode 110 is the gate electrode of the first transistor T1, and is separately provided for each semiconductor storage element 1, on the first gate insulation film 140. For example, the gate electrode 110 may include polysilicon or the like, or may include a metal having a lower resistance value than polysilicon. In addition, the gate electrode 110 may have a stack structure that includes a plurality of layers including a metal layer and a layer including polysilicon. For example, the gate electrode 110 may have a stack structure in which a metal layer including TiN or TaN and a layer including polysilicon are provided on the first gate insulation film 140. Such a stack structure allows the gate electrode 110 to prevent a depletion layer from forming in the layer including polysilicon due to a voltage applied.

A second gate insulation film 142 is a gate insulation film in the second transistor T2, and is provided on the activation region 22. Since the second transistor T2 functions as a switching element that controls voltage application to the first transistor T1, the second gate insulation film 142 includes an insulating material commonly used as a gate insulation film in a field effect transistor. For example, the second gate insulation film 142 may include oxynitride having insulation property such as silicon oxide ($SiO_x$) or silicon nitride ($SiN_x$), or may include hafnium oxide or the like having a higher dielectric constant than silicon oxide or the like.

However, it is needless to say that the second gate insulation film 142 may include a ferroelectric material as with the first gate insulation film 140. In such a case, it is possible to form the second gate insulation film 142 and the first gate insulation film 140 at the same time, thus making it possible to simplify a manufacturing process of the semiconductor storage element 1.

The gate electrode 112 is the gate electrode of the second transistor T2, and is provided on the second gate insulation film 142 to extend over a plurality of semiconductor storage elements 1. It is to be noted that the gate electrode 112 may include a similar material to the material included in the gate electrode 110. The gate electrode 112, which is extended over the plurality of semiconductor storage elements 1, functions as the first word line WL1, thus making it possible to omit a process for providing a separate word line, and to reduce a plane area of the semiconductor storage element 1.

A first source region 220 is a region of the first conductivity type and functions as the source region of the first transistor T1. For example, the first source region 220 may be formed by introducing an impurity of the first conductivity type (for example, an n-type impurity such as phosphorus (P) or arsenic (As)) into a predetermined region in the activation region 22. The first source region 220 is provided in the activation region 22 on a side that is opposed to, across the gate electrode 110, a side on which the gate electrode 112 is provided. The first source region 220 is coupled to, via the contact plug 300, the selection transistor Ts (not illustrated) and the power supply Vs (not illustrated) that are provided outside.

A first drain region 222 is a region of the first conductivity type and functions as one of the drain region of the first transistor T1 and the source or drain region of the second transistor T2. For example, the first drain region 222 may be formed by introducing an impurity of the first conductivity type into a predetermined region in the activation region 22. The first drain region 222 is provided in the activation region 22 between the gate electrode 110 and the gate electrode 112, and couples the drain of the first transistor T1 and one of the source and the drain of the second transistor T2.

In the present embodiment, the first transistor T1 is formed to have a threshold voltage (Vt) of 0 V or less in any of the writing and the erasing states even in a case where variation occurs. The threshold voltage (Vt) is a gate voltage that allows the first transistor T1 to turn on. For example, in the present embodiment, the concentration of an impurity of the second conductivity type (for example, a p-type impurity such as boron (B)) in a region below the gate electrode 110 of the first transistor T1 is set lower than the concentration of an impurity of the second conductivity type in a region below the gate of the second transistor T2. Alternatively, an impurity of the first conductivity type is implanted into a region below the gate electrode 110 of the first transistor T1 (counter-doping). At this time, the concentration of the impurity of the first conductivity type in the region below the gate electrode 110 of the first transistor T1 is set lower than the concentration of the impurity of the first conductivity type in the first source region 220 and the first drain region 222.

A second source/drain region 224 is a region of the first conductivity type, and functions as the source or drain region of the second transistor T2. For example, the second source/drain region 224 may be formed by introducing the foregoing impurity of the first conductivity type into a predetermined region in the activation region 22. The second source/drain region 224 is provided in the activation region 22 on a side that is opposed to, across the gate electrode 112, a side on which the gate electrode 110 is provided. The second source/drain region 224 is coupled to a bit line BL (not illustrated) via the contact plug 302.

Furthermore, it is preferable that the second transistor T2 be formed to have a threshold voltage (Vt) that suppresses leakage current. Thus, for example, the second transistor T2 is formed to include an impurity of the second conductivity type at a preferable concentration in a region below the gate electrode 112 of the second transistor T2.

Contact regions 110S, 112S, 220S, 222S, and 224S are each provided in the surface of a corresponding one of the gate electrodes 110 and 112, the first source region 220, the first drain region 222, and the second source/drain region 224, thus reducing contact resistance thereof. Specifically, the contact regions 110S, 112S, 220S, 222S, and 224S may include an alloy of a semiconductor or metal included in the semiconductor substrate 20 and the gate electrodes 110 and 112, and a refractory metal such as Ni. For example, the contact regions 110S, 112S, 220S, 222S, and 224S may include refractory metal silicide such as NiSi.

Sidewall insulation films 150 and 152 are each a sidewall that is provided on a side of each of the gate electrodes 110 and 112 and includes an insulation film. Specifically, it is possible to form the sidewall insulation films 150 and 152 by forming an insulation film in a region including the gate electrodes 110 and 112 and then performing etching having a vertical anisotropy. For example, the sidewall insulation films 150 and 152 may be formed to include a single layer or a plurality of layers, using oxynitride having insulation property such as silicon oxide ($SiO_x$) or silicon nitride ($SiN_x$).

The sidewall insulation films 150 and 152 have a function to block the injected impurity when introducing an impurity into the semiconductor substrate 20. Thus, this allows the sidewall insulation films 150 and 152 to perform self-aligning control on a positional relationship between each of the first source region 220, the first drain region 222, and the second source/drain region 224 into which the impurity is introduced, and each of the gate electrodes 110 and 112 (self-aligning). In addition, the sidewall insulation films 150 and 152 make it possible to form, between the source and drain regions and the gate electrode in each transistor, an LDD (Lightly-Doped Drain) region having the same conductivity as the source and drain regions and having a lower concentration.

A flattening film 30 is an insulating layer provided on the gate electrodes 110 and 112 across an entire surface of the semiconductor substrate 20. The flattening film 30 is embedded between the first and second transistors T1 and T2, to electrically insulate the wiring lines provided on the flattening film 30 and the first and second transistors T1 and T2. For example, the flattening film 30 may include oxynitride having insulation property such as silicon oxide ($SiO_x$) or silicon nitride ($SiN_x$).

It is to be noted that although not illustrated in FIG. 5, a liner layer including an insulating material may be provided between the gate electrodes 110 and 112 and the flattening film 30 across an entire surface of the semiconductor substrate 20. When forming the contact plugs 300 and 302, the liner layer provides a high etch selectivity between the contact plugs 300 and 302 and the flattening film 30, thereby preventing excessive progress of etching. For example, the liner layer may include oxynitride having insulation property such as silicon oxide ($SiO_x$) or silicon nitride ($SiN_x$).

In addition, the foregoing liner layer may be formed as a layer that applies compressive stress or tensile stress to the first gate insulation film 140 and the second gate insulation film 142. In such a case, by piezoelectric effect, the liner layer makes it possible to enhance a polarization characteristic of the first gate insulation film 140, and to enhance a carrier mobility of the second gate insulation film 142.

The contact plugs 300 and 302 are provided through the flattening film 30. Coupling of the contact plug 300 to the first source region 220 electrically couples the source of the first transistor T1 and each of the selection transistor Ts (not illustrated) and the power supply Vs (not illustrated) that are provided outside. In addition, coupling of the contact plug 302 to the second source/drain region 224 electrically couples another of the source and the drain of the second transistor T2 and a bit line BL (not illustrated).

It is to be noted that the foregoing contact plugs 300 and 302 may include a low-resistance metal such as titanium (Ti) or tungsten (W), or a metal compound such as titanium nitride (TiN). In addition, the contact plugs 300 and 302 may have a stack structure including a plurality of layers. More specifically, the contact plugs 300 and 302 may have a stack structure including Ti or TiN and W.

A wiring layer 42 is provided on the flattening film 30, extending in a direction orthogonal to a direction in which the activation region 22 is extended. The wiring layer 42 electrically couples the contact plug 300 and each of the selection transistor Ts (not illustrated) and the power supply Vs (not illustrated) that are provided outside. In other words, the wiring layer 42 couples the source of each first transistor T1 in the semiconductor storage element 1 and each of the selection transistor Ts and the power supply Vs that are provided outside. For example, the wiring layer 42 may include a metal material such as copper (Cu) or aluminum (Al).

An interlayer insulation film 40 in which wiring lines such as the wiring layer 42 are embedded is provided on the flattening film 30 across an entire surface of the semiconductor substrate 20. For example, the interlayer insulation film 40 may include oxynitride having insulation property such as silicon oxide ($SiO_x$) or silicon nitride ($SiN_x$).

A contact 52 is provided through an interlayer insulation film 50, to electrically couple the wiring layer 42 provided in the interlayer insulation film 40 and a wiring layer 62 provided on the interlayer insulation film 50. The contact 52, as with the contact plugs 300 and 302, may include a low-resistance metal such as T1 or W, or a metal compound such as TiN. In addition, the contact 52 may have a stack structure including a plurality of layers. Specifically, the contact 52 may have a stack structure including Ti or TiN and W, or may be formed into a dual-damascene structure including Cu at the same time with the wiring layer 62.

The interlayer insulation film 50 is provided on the interlayer insulation film 40 across an entire surface of the semiconductor substrate 20. For example, the interlayer insulation film 50 may include oxynitride having insulation property such as silicon oxide ($SiO_x$) or silicon nitride ($SiN_x$).

The wiring layer 62 is provided on the interlayer insulation film 50, extending in a direction parallel to a direction in which the activation region 22 is extended. In addition, the wiring layer 62 is electrically coupled to the contact 52, and the contact 52 is electrically coupled to the contact plug 302. The wiring layer 62 functions as a bit line BL that is electrically coupled to another of the source and the drain of each second transistor T2 in the semiconductor storage element 1. For example, the wiring layer 62 may include a metal material such as copper (Cu) or aluminum (Al).

An interlayer insulation film 60 in which wiring lines such as the wiring layer 62 are embedded is provided on the interlayer insulation film 50 across an entire surface of the semiconductor substrate 20. For example, the interlayer insulation film 60 may include oxynitride having insulation property such as silicon oxide ($SiO_x$) or silicon nitride ($SiN_x$).

According to the foregoing structure, it is possible to configure, in a small plane area, the semiconductor storage element 1 that makes it possible to perform stable writing of information. Therefore, according to the present embodiment, it is possible to enhance a degree of integration of the semiconductor storage element 1, thus making it possible to enhance a storage density of the semiconductor storage device 10 in which the semiconductor storage elements 1 are integrated. For example, in the technique disclosed in the foregoing NPTL 1 and PTL 1, a voltage corresponding to one third of an invertible voltage is applied to an unselected memory cell (semiconductor storage element), which results in a complicated circuit configuration and an increase in a plane area of a memory cell. In addition, the technique disclosed in the foregoing PTLs 2 and 3 involves providing an additional transistor and a wiring line that couples the additional transistor and the memory cell for each memory cell, which results in an increase in the plane area covered by each memory cell. Whereas, according to the present embodiment, no complicated circuit configuration or additional transistor or the like is provided, thus making it possible to avoid an increase in a plane area of the semiconductor storage element 1. Furthermore, in the technique disclosed in the foregoing NPTL1 and PTL 1, the foregoing circuit configuration to apply a voltage is provided, which results in an increase in power consumption accordingly. However, according to the present embodiment, the foregoing circuit configuration is not provided, thus making it possible to avoid an increase in power consumption.

[1.4. Method of Manufacturing Semiconductor Storage Device]

With reference to FIGS. 6 to 12, a method of manufacturing the semiconductor storage device 10 according to the present embodiment is subsequently described. FIGS. 6 to 12 are each a plan view and cross-sectional view that describes each manufacturing process of the semiconductor storage device 10 according to the present embodiment.

First, as illustrated in FIG. 6, the activation region 22 and the element isolation region 26 are formed in the semiconductor substrate 20.

Specifically, on the semiconductor substrate 20 including silicon (Si), an $SiO_2$ film is formed by dry oxidation or the like, and an $Si_3N_4$ film is further formed by a Low Pressure CVD (Chemical Vapor Deposition) method or the like. Subsequently, on the $Si_3N_4$ film, a resist layer patterned to protect a region included in the activation region 22 is formed, and the $SiO_2$ film, the $Si_3N_4$ film, and the semiconductor substrate 20 are etched at a depth of 350 nm to 400 nm.

Next, $SiO_2$ is formed into a film at a film thickness of 650 nm to 700 nm, to be embedded in an opening formed due to etching, thus forming the element isolation region 26. In forming the $SiO_2$ film, for example, it is possible to use a high-density plasma CVD method. This method makes it possible to form an $SiO_2$ film having satisfactory step coverage and high density.

Subsequently, the surface of the semiconductor substrate 20 is flattened by polishing using a CMP (Chemical Mechanical Polish) method or the like. Polishing by CMP removes the $SiO_2$ film that protrudes from the opening. In addition, for example, the foregoing polishing is performed to a degree that allows for removing the $SiO_2$ film from the $Si_3N_4$ film.

Furthermore, the $Si_3N_4$ film is removed using thermal phosphoric acid or the like. It is to be noted that to increase the density of the $SiO_2$ film in the element isolation region 26, or to round off a corner of the activation region 22, annealing may be performed on the semiconductor substrate 20 under an environment of $N_2$, $O_2$, or $H_2/O_2$ prior to removing the $Si_3N_4$ film.

Next, a sacrificial oxide film (not illustrated) is formed by oxidizing, by about 10 nm, a region corresponding to the activation region 22 in the semiconductor substrate 20, and then ion implantation of an impurity of a second conductivity type (for example, boron (B) or the like) is performed, to form the activation region 22 of the second conductivity type.

In the present embodiment, the first transistor T1 is formed to have a threshold voltage (Vt) of 0 V or less in any of the writing and the erasing states even in a case where variation occurs. The threshold voltage (Vt) is a gate voltage that allows the first transistor T1 to turn on. Thus, for example, the concentration of the impurity of the second conductivity type in a region below the gate of the first transistor T1 is set lower than the concentration of the impurity of the second conductivity type in a region below the gate of the second transistor T2. Alternatively, an impurity of the first conductivity type (for example, phosphorus (P), arsenic (As) or the like) is implanted in a region below the gate of the first transistor T1 (counter-doping). At this time, the concentration of the impurity of the first conductivity type in the region below the gate of the first transistor T1 is set lower than the concentration of the impurity of the first conductivity type in the first source region 220 and the first drain region 222.

In addition, in the present embodiment, it is preferable that the second transistor T2 be formed to have a threshold voltage (Vt) that suppresses leakage current. Thus, for example, it is preferable to perform ion implantation that results in a preferable concentration of the impurity of the second conductivity type in the region below the gate of the second transistor T2.

Next, as illustrated in FIG. 7, the first gate insulation film 140 and the second gate insulation film 142 are formed, and then the gate electrodes 110 and 112 are formed on the first gate insulation film 140 and the second gate insulation film 142, respectively.

Specifically, first, the sacrificial oxide film covering the surface of the semiconductor substrate 20 is stripped by hydrofluoric acid solution or the like. Subsequently, using processing such as RTO (Rapid Thermal Oxidization) processing, oxygen plasma processing, or processing by a chemical containing hydrogen peroxide, an $SiO_2$ film, which serves as a base for the first gate insulation film 140 and the second gate insulation film 142, is formed on the semiconductor substrate 20 at a film thickness of 0.5 nm to 1.5 nm. Subsequently, hafnium oxide ($HfO_x$) that is a high dielectric substance is formed into a film using a CVD method or ALD (Atomic Layer Deposition) method or the like. This forms the first gate insulation film 140 and the second gate insulation film 142.

It is to be noted that in the present embodiment, in place of hafnium oxide, it is possible to use zirconium oxide ($ZrO_x$), hafnium-zirconium oxide ($HfZrO_x$) or the like. In addition, these high dielectric substances may be converted into a ferroelectric film by doping lanthanum (La), silicon (Si), or gadolinium (Gd) or the like therein, thus forming the first gate insulation film 140 and the second gate insulation film 142.

Next, a TiN film is formed at a film thickness of 5 nm to 20 nm, using a sputtering method, a CVD method or ALD method or the like, and then polysilicon is formed into a film at a film thickness of 50 nm to 150 nm using the Low-Pressure CVD method by $SiH_4$ gas, at a film-forming temperature of 580° C. to 620° C., for example. Furthermore, anisotropic etching using HBr gas or Cl-containing gas is performed on a patterned resist as a mask, thus forming the gate electrodes 110 and 112. It is to be noted that in the present embodiment, it is also possible to use TaN or the like in place of TiN.

In addition, in the present embodiment, after patterning the resist, it is also possible to perform trimming processing on the resist by $O_2$ plasma and thereby reduce a width of the gate electrodes 110 and 112 that are to be formed after anisotropic etching. For example, in 32-nm process, the gate electrode may have a width (gate length) of 20 nm to 30 nm.

It is to noted that in the foregoing description, the first transistor T1 and the second transistor T2 are formed at the same time, but the present embodiment is not limited to this, and the first transistor T1 and the second transistor T2 may be formed by separate processes.

Next, as illustrated in FIG. 8, after the sidewall insulation films 150 and 152 are formed on both sides of each of the gate electrodes 110 and 122, the first source region 220, the first drain region 222, and the second source/drain region 224 are formed.

Specifically, first, for example, $Si_3N_4$ is formed into a film at a film thickness of 5 nm to 15 nm using the Low-Pressure CVD method, and then anisotropic etching is performed. In this manner, an offset spacer (not illustrated) is formed on both sides of each of the gate electrodes 110 and 122.

Next, ion implantation of an impurity of the first conductive type (phosphorus (P), arsenic (As) or the like) is performed at 5 keV to 10 keV at a concentration of 5 to $20 \times 10^{14}$ ions/cm$^2$, to form the LDD region. Forming the LDD region after forming the offset spacer makes it possible to suppress short channel effect, thus making it possible to suppress characteristic variation in the first and second transistors T1 and T2.

Subsequently, $SiO_2$ is formed into a film by the plasma CVD method at a film thickness of 10 nm to 30 nm, and $Si_3N_4$ is further formed into a film by the plasma CVD method at a film thickness of 30 nm to 50 nm, and then anisotropic etching is performed, thus forming the sidewall insulation films 150 and 152 on both sides of each of the gate electrodes 110 and 122.

Subsequently, ion implantation of an impurity of the first conductivity type (phosphorus (P), arsenic (As) or the like) is performed at 40 keV to 50 keV at a concentration of 1 to $2 \times 10^{15}$ ions/cm$^2$, to thereby introduce the impurity of the first conductivity type into an exposed region in the activation region 22. Furthermore, RTA (Rapid Thermal Annealing) is performed for five seconds at 1000° C., to thereby activate the ion-implanted impurity. This forms the source and drain regions 220, 222, and 224 in the first and second transistors T1 and T2. It is to be noted that in the present embodiment, to prevent diffusion of the impurity to an unintended region, it is also possible to activate the impurity by Spike RTA. In addition, it is possible to convert the first gate insulation film 140 into a ferroelectric substance by the annealing (thermal processing). At any time after the first gate insulation film 140 is formed, it is possible to perform annealing and convert the first gate insulation film 140 into the ferroelectric substance.

Subsequently, as illustrated in FIG. 9, the contact regions 110S, 112S, 220S, 222S, and 224S are formed in the surface of the gate electrodes 110 and 112, the first source region 220, the first drain region 222, and the second source/drain region 224.

Specifically, after nickel (Ni) is formed into a film at a film thickness of 6 nm to 8 nm using the sputtering method or the like, RTA is performed for 10 seconds to 60 seconds at 300° C. to 450° C., to thereby combine nickel (Ni) on Si with Si (in other words, silicidation). This forms the contact regions 110S, 112S, 220S, 222S, and 224S having low resistance. It is to be noted that unreacted Ni on the element isolation region 26 and the like may be removed using $H_2SO_4/H_2O_2$.

Here, it is also possible to form the contact regions 110S, 112S, 220S, 222S, and 224S in $CoSi_2$ or NiSi by forming, in place of Ni, cobalt (Co) or nickel platinum (NiPt) into a film. It is preferable that a condition for the RTA at this time be appropriately set in accordance with a metal on which silicidation is performed.

It is to be noted that at the same time with the foregoing process, it is also possible to form, in a region other than the region in which the semiconductor storage element 1 is formed, a field effect transistor that is included in a logic circuit such as a CMOS. In this manner, it is possible to manufacture, by a smaller number of processes, an LSI mounted with the semiconductor storage device 10 including the semiconductor storage element 1 and a logic circuit such as a CMOS. However, in the field effect transistor included in the logic circuit, the gate insulation film includes an insulator such as an oxide film instead of a ferroelectric substance.

Next, as illustrated in FIG. 10, the flattening film 30 is formed across an entire surface of the semiconductor substrate 20, and the contact plugs 300 and 302 are further formed.

Here, the liner layer may be formed by forming SiN into a film at a film thickness of 10 nm to 50 nm, using the plasma CVD method. In addition, it is also possible to form the liner layer by the Low-Pressure CVD method or ALD method. In a case where the liner layer is provided, through performance of etching with a condition that enables high selectivity for the liner layer and the flattening film 30, it is possible to prevent excessive etching and perform etching with better controllability. In addition, it is also possible to form the liner layer as a layer that applies compressive stress or tensile stress. For example, with the following example condition, it is possible to form the liner layer as a layer that applies compressive stress or tensile stress.

For example, in a case of forming the liner layer as a layer that applies tensile stress, it is sufficient to supply nitrogen ($N_2$) gas (500 cm$^3$/min to 2000 cm$^3$/min), ammonia ($NH_3$) gas (500 cm$^3$/min to 1500 cm$^3$/min), and monosilane ($SiH_4$) gas (50 cm$^3$/min to 300 cm$^3$/min) into a chamber, and to form a film through chemical reaction by the plasma CVD method, with a temperature of the semiconductor substrate 20 at 200° C. to 400° C., a film-forming pressure at 0.67 kPa to 2.0 kPa, and RF power at 50 W to 500 W. Furthermore, after forming the film, it is also possible to form the liner layer that applies tensile stress, by supplying helium (He) gas (10 L/min to 20 L/min) and performing ultraviolet (Ultra Violet: UV) irradiation processing with a lamp power at 1 kW to 10 kW, a temperature at 400° C. to 600° C., and a pressure at 0.67 kPa to 2.0 kPa.

In addition, in a case of forming the liner layer as a layer that applies compressive stress, hydrogen ($H_2$) gas (1000 cm$^3$/min to 5000 cm$^3$/min), nitrogen ($N_2$) gas (500 cm$^3$/min to 2500 cm$^3$/min), argon (Ar) gas (1000 cm$^3$/min to 5000 cm$^3$/min), ammonia ($NH_3$) gas (50 cm$^3$/min to 250 cm$^3$/min), and trimethylsilane (($CH_3$)$_3$SiH) gas (10 cm$^3$/min to 50 cm$^3$/min) are supplied into a chamber, to form a film through chemical reaction by the plasma CVD method, with a temperature of the semiconductor substrate 20 at 400° C. to 600° C., a film-forming pressure at 0.13 kPa to 0.67 kPa, and RF power at 50 W to 500 W, thus making it possible to form the liner layer that applies compressive stress.

Next, $SiO_2$ is formed into a film using the CVD method or the like at a film thickness of 100 nm to 500 nm, and then flattening is performed by a CMP method, thus forming the flattening film 30. Subsequently, etching is performed on the flattening film 30, to form an opening above the first source region 220 and the second source/drain region 224.

Next, at the opening formed by etching, titanium (Ti) and titanium nitride (TiN) are formed into a film by the CVD method or the like. Then tungsten (W) is further formed into a film, and flattening is performed by the CMP method, thus forming contact plugs 300 and 302. It is to be noted that Ti and TiN may be formed into a film by a sputtering method using IMP (Ion Metal Plasma) or the like. In addition, flattening may be performed by full etch back in place of the CMP method.

Subsequently, as illustrate in FIG. 11, wiring lines including the wiring layer 42 are provided on the flattening film 30. Specifically, by a damascene method, the wiring lines including the wiring layer 42 are formed using a wiring material such as copper (Cu). The wiring layer 42 is formed above the contact plug 300 in each semiconductor storage element 1, thus functioning as a wiring line that couples the first source region 220 in the first transistor T1 and the power supply Vs provided outside. In addition, the wiring line formed above the contact plug 302 functions as a base for a bit line BL, which is to be formed in a subsequent stage. It is to be noted that the wiring lines including the wiring layer 42 may include aluminum (Al) or the like.

Next, as illustrated in FIG. 12, the interlayer insulation film 50 is formed, and the contact 52 is further formed above the contact plug 302.

Specifically, $SiO_2$ is formed into a film using the CVD method or the like at a film thickness of 100 nm to 500 nm, and then flattening is performed by the CMP method, thus forming the interlayer insulation film 50.

Subsequently, etching is performed on the interlayer insulation film 50, to form an opening in a region above the contact plug 302. Next, at the opening formed by etching, titanium (Ti) and titanium nitride (TiN) are formed into a film by the CVD method or the like. Then, tungsten (W) is further formed into a film, and flattening is performed by the CMP method, thus forming the contact 52.

Subsequently, on the interlayer insulation film 50, the interlayer insulation film 60 including the wiring layer 62 is formed. Specifically, by the damascene method, wiring lines including the wiring layer 62 are formed using a wiring material such as copper (Cu). In addition, $SiO_2$ is formed into a film using the CVD method or the like at a film thickness of 50 nm to 200 nm, to bury the wiring lines including the wiring layer 62, thus forming the interlayer insulation film 60. In this manner, the semiconductor storage device 10 according to the present embodiment as illustrated in FIG. 5 is formed.

The wiring layer 62 is formed above the contact plug 302 in each semiconductor storage element 1, thus functioning as a bit line BL that is coupled to another of the source and the drain of the second transistor T2. It is to be noted that the wiring lines including the wiring layer 62 may include aluminum (Al) or the like. In addition, it is also possible to form the contact 52 and the wiring layer 62 into a dual-damascene structure by burying the contact 52 and the wiring layer 62 at the same time, using a wiring material such as copper (Cu). In such a case, it is possible to form the wiring layer 62 as a wiring line having lower resistance.

2. Second Embodiment

[2.1. Overview of Semiconductor Storage Element and Semiconductor Storage Device]

In the present embodiment, compared to the foregoing first embodiment, a third transistor T3 is further provided to prevent a write voltage from being applied to the ferroelectric film in the first transistor T1 in the semiconductor storage element 1 that is selected. In the present embodiment, providing the third transistor T3 prevents application of external electric field to a semiconductor storage element 1a that is not selected, thus making it possible to prevent rewriting stored information. In the following, with reference to FIGS. 13 and 14, an overview of the semiconductor storage element 1a and a semiconductor storage device 10a according to a second embodiment of the present disclosure is described. FIG. 13 is a circuit diagram that illustrates a circuit configuration of the semiconductor storage element 1a according to the present embodiment. In addition, FIG. 14 is an explanatory diagram that schematically illustrates a planar structure of the semiconductor storage device 10a according to the present embodiment.

As illustrated in FIG. 13, the semiconductor storage element 1a according to the present embodiment includes the first transistor T1, the second transistor T2 coupled to the drain of the first transistor T1, and the third transistor T3 coupled to the gate of the first transistor T1. It is to be noted that as in the first embodiment, the first transistor T1 has a source coupled to the power supply Vs via the selection transistor Ts provided outside the semiconductor storage element 1.

As in the first embodiment, also in the present embodiment, the first transistor T1 is a field effect transistor having a gate electrode film that includes a ferroelectric material at least partially. The second transistor T2 is a field effect transistor having one of a source and a drain coupled to a drain of the first transistor, while having another of the source and the drain coupled to a second bit line BL2. In addition, the second transistor T2 has a gate coupled to a word line WL, and on and off of a channel is controlled by a voltage applied from the word line WL.

As in the first embodiment, in the first transistor T1 according to the present embodiment, the first transistor T1 has a threshold voltage (Vt) of 0 V or less in any of the writing and the erasing states even in a case where variation occurs. In addition, in the present embodiment, as in the first embodiment, it is preferable that the second transistor T2 have a threshold voltage that suppresses leakage current.

Furthermore, the third transistor T3 is a field effect transistor having one of a source and a drain coupled to the gate of the first transistor T1, while having another of the source and the drain coupled to a first bit line BL1. In addition, the third transistor T3 has a gate coupled to a word line WL, and on and off of a channel is controlled by a voltage applied from the word line WL.

Thus, in the present embodiment, in a case of writing information to the semiconductor storage element 1a, first, a voltage is applied from the word line WL, to turn on the channel in each of the second and third transistors T2 and T3. Next, a predetermined voltage is applied to the first and second bit lines BL1 and BL2, thus applying electric field to the gate insulation film in the first transistor T1. In this manner, it is possible to control the direction of residual polarization of the gate insulation film in the first transistor T1 by external electric field, and to write information to the semiconductor storage element 1a.

At this time, in another semiconductor storage element 1a that is coupled to the word line WL that is selected, no voltage is applied to the first and second bit lines BL1 and BL2, thus not causing electric field to be applied to the gate insulation film in the first transistor T1. In addition, in another semiconductor storage element 1a that is coupled to the first and second bit lines BL1 and BL2 that are selected, although a voltage is applied to the first and second bit lines BL1 and BL2, the channels in the second and third transistors T2 and T3 are off, thus not causing electric field to be applied to the gate insulation film in the first transistor T1.

Therefore, in the semiconductor storage element 1a according to the present embodiment, external electric field is not applied to the semiconductor storage element 1a that is not selected, thus making it possible to prevent rewriting stored information.

In addition, in the present embodiment, when reading information from the semiconductor storage element 1a, first, the channels in the second and third transistors T2 and T3 are turned on by applying a voltage to the word line WL, and the channel in the first transistor T1 is turned on by applying a voltage to the first bit line BL1. Next, in the present embodiment, the channel in the selection transistor Ts is turned on, and then a voltage is applied to the second bit line BL2, thus causing a current to flow from the drain to the source in the first transistor T1. Then, it is possible to read information from the semiconductor storage element 1a by measuring the current flowing in the first transistor T1.

At this time, in another semiconductor storage element 1a that is coupled to a word line WL that is selected, no voltage is applied to the first and second bit lines BL1 and BL2, thus not causing electric field to be applied to the first transistor T1. In addition, in another semiconductor storage element 1a that is coupled to the first and second bit lines BL1 and BL2 that are selected, although a voltage is applied to the first and second bit lines BL1 and BL2, the channels in the second and third transistors T2 and T3 are off, thus not causing electric field to be applied to the first transistor T1. Therefore, in the semiconductor storage element 1a according to the present embodiment, even when reading information, external electric field is not applied to the semiconductor storage element 1a that is not selected, thus making it possible to prevent deterioration of the ferroelectric film included in the gate insulation film.

For example, in the technique disclosed in the foregoing NPTL 1 and PTL 1, a voltage is applied to a ferromagnetic film in an unselected memory cell (semiconductor storage element), although the voltage is below an invertible voltage (Vdd) that allows inverting the polarization direction (for example, ⅓ Vdd, ½ Vdd, ⅔ Vdd, etc.). Therefore, there is a possibility that repeated application of voltage causes deterioration in the ferroelectric film, which results in a decrease in reliability of information stored in the memory cell. However, in the present embodiment, no voltage is applied to the semiconductor storage element 1a that is not selected, thus making it possible to suppress deterioration in the ferroelectric film, and to avoid a decrease in reliability of information stored in the semiconductor storage element 1a.

Subsequently, with reference to FIG. 14, a schematic structure of the semiconductor storage device 10a that includes a plurality of semiconductor storage elements 1a each having the circuit configuration illustrated in FIG. 13 is described. It is to be noted that in the following description, for common points with the semiconductor storage element 1 according to the first embodiment, the description thereof is omitted.

As illustrated in FIG. 14, the semiconductor storage device 10a includes a plurality of semiconductor storage elements 1a arranged in an array. Specifically, each semiconductor storage element 1a is provided in a region separated by a dashed line in FIG. 12. Furthermore, in the region, the first, second, and third transistors T1, T2, and T3 are provided.

The gate electrode 110 of the first transistor T1 is extended to an activation region 24 beyond an element isolation region having insulation property, and is coupled to one of the source and drain regions of the second transistor T2, in a shared contact 160. It is to be noted that the gate electrode 110 of the first transistor T1 is separately provided for each semiconductor storage element 1a, and is not coupled to the gate electrode 110 of the first transistor T1 in another semiconductor storage element 1a. In this manner, this allows the first transistor T1 to apply a voltage to the gate electrode 110 in each semiconductor storage element 1a, thus making it possible to suppress influence on another semiconductor storage element 1a when writing or reading information stored in the gate insulation film.

The third transistor T3 is formed by providing the gate electrode 112 above the activation region 24 that is doped in the second conductivity type. In addition, the activation regions 24 sandwiching the gate electrode 112 are each doped in the first conductivity type, and included in the drain region and the source region of the third transistor T3.

In addition, as described above, one of the source and drain regions of the third transistor T3 is coupled to the gate electrode 110 of the first transistor T1, in the shared contact 160. Meanwhile, another of the source and drain regions of the third transistor T3 is coupled to the first bit line BL1 via the contact plug 302. In addition, the gate electrode 112 of the third transistor T3 is extended to the activation region 22 beyond the element isolation region having insulation property, and doubles as the gate electrode of the second transistor T2. The gate electrode 112 is further extended to another semiconductor storage element beyond the element isolation region and functions as a word line WL.

For example, a plurality of semiconductor storage elements 1a, each of which includes the first, second, and third transistors T1, T2, and T3 as described above, is arranged in a matrix on a semiconductor substrate, thus functioning as the semiconductor storage device 10a that stores various sets of information.

[2.2. Structure of Semiconductor Storage Device]

Subsequently, a specific structure of the semiconductor storage device 10a according to the present embodiment is described with reference to FIG. 15. FIG. 15 is an explanatory diagram that illustrates a planar structure and a cross-sectional structure of the semiconductor storage device 10a according to the present embodiment. In detail, a plan view illustrating the planar structure of the semiconductor storage device 10a is illustrated on the lower left side of FIG. 15, a cross-sectional view taken along line A-A' in the plan view is illustrated on the upper left side, and a cross-sectional view taken along line B-B' in the plan view is illustrated on the lower right side. It is to be noted that unless otherwise specified, the third transistor T3 has a configuration similar to the configuration of the second transistor T2.

As illustrated in FIG. 15, on the semiconductor substrate 20, activation regions 22 and 24 are provided in strips parallel to each other, and the gate electrodes 110 and 112 are provided above the activation regions 22 and 24, thus forming the first, second, and third transistors T1, T2, and T3. In addition, the first transistor T1 has a gate, a source, and a drain each coupled to a corresponding one of wiring lines via the contact plug 230, the second transistor T2 has a gate, a source, and a drain each coupled to a corresponding one of wiring lines via the contact plug 300, and the third transistor T3 has a gate, a source, and a drain each coupled to a corresponding one of wiring lines via the contact plug 302, thus configuring the semiconductor storage element 1a having the circuit configuration illustrated in FIG. 13. Furthermore, a large number of semiconductor storage elements 1a are integrated in an array on the semiconductor substrate 20, thus configuring the semiconductor storage device 10a.

Each of the activation regions 22 and 24 is a region of the second conductivity type, and provided in strips isolated from each other by the element isolation region 26. It is to be noted that the activation region 24 functions as a channel region in the first and second transistors T1 and T2, and the activation region 22 functions as a channel region in the third transistor T3.

A third source/drain region 226 is a region of the first conductivity type and functions as the source or drain region in the third transistor T3. The third source/drain region 226 is provided in the activation region 24 on the same side as the gate electrode 110 is provided with respect to the gate electrode 112, and is coupled to the gate electrode 110 via the shared contact 160.

In addition, it is needless to say that, as with the first transistor T1, the gate insulation film in the third transistor T3 may include a ferroelectric material. In this manner, it is possible to form the gate insulation films in the first and third transistors T1 and T3 at the same time, thus making it possible to simplify a manufacturing process of the semiconductor storage element 1.

A contact region 226S, which is provided in a surface of the third source/drain region 226, reduces contact resistance. In addition, a contact plug 230 is provided through the flattening film 30. The contact plug 230 electrically couples another of the source and the drain of the third transistor T3 and the first bit line BL1 (not illustrated).

The shared contact 160 is provided through the flattening film 30 to extend over the gate electrode 110 and the third source/drain region 226, to electrically couple the gate electrode 110 and the third source/drain region 226. This makes it possible to electrically couple the gate electrode 110 and the third source/drain region 226 without providing a separate wiring line, thus making it possible to reduce an area of the semiconductor storage element 1a.

According to the foregoing structure, it is possible to configure, in a smaller plane area, the semiconductor storage element 1a that makes it possible to prevent application of a voltage to the semiconductor storage element 1a that is not selected and apply a voltage only to the semiconductor storage element 1a that is selected. Therefore, according to the present embodiment, it is possible to enhance a degree of integration of the semiconductor storage element 1a, thus making it possible to enhance a storage density of the semiconductor storage device 10a in which the semiconductor storage elements 1a are integrated.

[2.3. Method of Manufacturing Semiconductor Storage Device]

Subsequently, a method of manufacturing the semiconductor storage device 10a according to the present embodiment is described with reference to FIGS. 16 to 18. FIGS. 14 to 16 are each a plan view and a cross-sectional view that describe each manufacturing process of the semiconductor storage device 10a according to the present embodiment. It is to be noted that the manufacturing method according to the present embodiment includes processes in common with the manufacturing method of the semiconductor storage device 10 according to the first embodiment as illustrated in FIGS. 6 to 9, and therefore the descriptions of these processes are omitted.

First, in the present embodiment, each manufacturing process of the semiconductor storage device 10 according to the first embodiment as illustrated in FIGS. 6 to 9 is also performed. Then, as illustrated in FIG. 16, the flattening film 30 and the contact plugs 230, 300, and 302 are formed. This process is performed similarly to the manufacturing process according to the foregoing first embodiment as illustrated in FIG. 10. It is to be noted that at this time, the gate electrode 110 and the third source/drain region 226 may be directly coupled to each other with a double plug, without via a wiring layer (shared contact). In this manner, it is possible to reduce an area of a wiring region.

Then, as illustrated in FIG. 17, the wiring layer 42 is formed. This process is performed similarly to the manufacturing process according to the foregoing first embodiment as illustrated in FIG. 11. It is to be noted that the wiring layer 42 that is formed is coupled to the source of the first transistor T1, to be a power supply line coupled to the power supply Vs.

Next, as illustrated in FIG. 18, the interlayer insulation film 50 is formed, and the contact 52 is further formed above the contact plug 302. This process is performed similarly to the manufacturing process according to the foregoing first embodiment as illustrated in FIG. 12.

Furthermore, as in the first embodiment, the wiring layer 62 is formed, thus making it possible to obtain the semiconductor storage device 10a illustrated in FIG. 15.

3. Third Embodiment

[3.1. Writing Operation]

As a third embodiment of the present disclosure, a writing operation of the semiconductor storage element 1 that allows performance of more stable writing by applying a bias voltage to the semiconductor substrate 20 is described with reference to FIG. 4. It is to be noted that the writing operation is applicable to any of the semiconductor storage elements 1 and 1a according to the foregoing first and second embodiments.

As described earlier, as illustrated in the upper row in FIG. 4, when writing to the first transistor T1 in the erasing state, an upward residual polarization of the ferroelectric film in the first transistor T1 is less likely to form the channel 500, which results in a higher threshold voltage (Vt) of the first transistor T1. In addition, microfabricating the semiconductor storage element 1 results in a larger variation in the threshold voltage of the first transistor T1. Thus, even if the writing operation is performed on the semiconductor storage element 1, due to shifting of the threshold voltage resulting from the residual polarization and variation, there is a case where the channel 500 is not formed in the surface of the semiconductor substrate 20 below the gate electrode 110 of the first transistor T1. In this case, even if there is a desired potential difference between the gate electrode 110 and the semiconductor substrate 20, the channel 500 is not formed, thus generating only a potential difference equal to or lower than the desired potential difference, between the surface of the semiconductor substrate 20 below the gate electrode 110 and the gate electrode 110. As a result, due to the small potential difference applied, there is a case where the ferroelectric film in the first transistor T1 becomes polarized downward, and does not turn into the writing state.

Thus, in the present embodiment, during the writing operation, a bias voltage is applied to the semiconductor substrate 20. More specifically, in the writing operation as illustrated in FIG. 4, for example, a voltage higher than a source voltage is applied to the semiconductor substrate 20. In this manner, the threshold voltage (Vt) of the first transistor T1 is controlled to be low, thus forming the channel 500 in the surface of the semiconductor substrate 20 below the gate electrode 110 of the first transistor T1. Thus, forming of the channel 500 generates a desired potential difference between the surface of the semiconductor substrate 20 below the gate electrode 110 and the gate electrode 110. Then, this potential difference causes the ferroelectric film in the first transistor T1 to be polarized in a desired direction, thus making it possible to write information to the semiconductor storage element 1. In other words, according to the present embodiment, it is possible to perform stable writing to the semiconductor storage element 1 by applying a bias voltage to the semiconductor substrate 20.

[3.2. Reading Operation]

Next, as the present embodiment, with reference to FIG. 19, described is a reading operation of the semiconductor storage element 1 that allows performance of more stable writing by applying a bias voltage to the semiconductor substrate 20. It is to be noted that the reading operation is applicable to any of the semiconductor storage elements 1 and 1a according to the foregoing first and second embodiments.

In addition, FIG. 19 is a graph that illustrates a relationship between a gate voltage (Vg) and a drain current (Log(Id)) in the semiconductor storage element 1 according to the present embodiment. In addition, in FIG. 19, a horizontal axis indicates the gate voltage, and a vertical axis indicates the drain current on a logarithmic scale. In addition, a band 610 indicated by a solid line on the right side indicates a range of the gate voltage and the drain current in the semiconductor storage element 1 in the writing state, with manufacturing variation in the semiconductor storage element 1 taken into account. A band 620 indicated by a dashed line on the left side indicates a range of the gate voltage and the drain current in the semiconductor storage element 1 in the erasing state, with manufacturing variation in the semiconductor storage element 1 taken into account. Thus, a difference between the band 610 and the band 620 corresponds to a memory window 600 that is a shift amount of the threshold voltage.

As illustrated in FIG. 19, manufacturing variation in the semiconductor storage element 1 narrows the memory window 600, which results in a smaller current difference caused by a difference in polarization state of the semiconductor storage element 1, thus making it difficult to determine the state of the semiconductor storage element 1.

More specifically, for example, in a case where it is intended to read information from the semiconductor storage element 1 at a gate voltage (Vg) of 0 V, the narrowness of the memory window 600 makes it difficult to determine the state of the semiconductor storage element 1. One reason for this is that in the present embodiment of the disclosure, the first transistor T1 is set to have a small threshold voltage (Vt), thus resulting in a small threshold voltage of the semiconductor storage element 1 in the writing state. Then, this results in a higher read current in the writing state accordingly.

Then, in the present embodiment, during the reading operation, a bias voltage is applied to the semiconductor substrate 20. More specifically, in the reading operation, a voltage lower than the source voltage is applied to the semiconductor substrate 20. The threshold voltage (Vt) of the first transistor T1 is controlled to be high in this manner. Since this allows for setting a low read current for the semiconductor storage element 1 in the writing state, it is possible to enlarge the memory window 600. In other words, a state in which reading is performed by applying a bias voltage as described above is the same as a state in which reading is performed at a voltage indicated by Vread in FIG. 19. Thus, according to the present embodiment, it is possible to perform stable reading from the semiconductor storage element 1 by applying a bias voltage to the semiconductor substrate 20.

4. Summary

As described above, in embodiments of the present disclosure, the first transistor T1 is formed to have a threshold voltage (Vt) of 0 V or less in any of the writing and the erasing states even if there is manufacturing variation. Thus, according to the present embodiment, in any of the writing and the erasing states, the channel 500 is constantly formed in the surface of the semiconductor substrate 20 below the gate electrode 110 of the first transistor T1, and a desired potential difference is applied between the gate electrode 110 and the surface of the semiconductor substrate 20. As a result, according to the present embodiment, it is possible to perform stable writing to the ferroelectric film in the first transistor T1.

Furthermore, the semiconductor storage device 10 according to the present embodiment may be mounted on the same semiconductor chip together with a semiconductor circuit included in an arithmetic device, etc., to be included in a semiconductor system (System-on-a-Chip: SoC). In addition, the semiconductor storage device 10 according to the present embodiment may be mounted in various types of electrical equipment that allows for mounting a semiconductor storage device. For example, the semiconductor storage device 10 may be mounted in various types of mobile devices (a smartphone, a tablet PC (personal computer) and the like), a laptop computer, a wearable device, a game device, a music device, a video device, a digital camera and the like as memory for temporary storage or as a storage.

5. Supplement

Although some preferred embodiments of the present disclosure have been described in detail above with reference to the attached drawings, the technical scope of the present disclosure is not limited to these examples. It is obvious that those ordinarily skilled in the art in the technical field of the present disclosure will easily arrive at various alterations or modifications within the technical scope described in the claims, and it is understood that these naturally belong to the technical scope of the present disclosure.

In addition, it is to be noted that effects described herein are merely descriptive or illustrative and are not limitative. In other words, in addition to or in place of the effects described above, the technology according to the present disclosure may have other effects explicit to those skilled in the art from the description herein.

It is to be noted that the following configuration also belongs to the technical scope of the present disclosure.

(1)

A semiconductor storage element, including:

a first transistor that has a gate insulation film including at least partially a ferroelectric material, and is a transistor to which information is written; and a second transistor that is coupled to, at one of a source and a drain, a source or a drain of the first transistor, the first transistor having a threshold voltage smaller than 0 V when writing information and a threshold voltage smaller than 0 V when erasing information.

(2)

The semiconductor storage element according to (1), in which the second transistor has a gate insulation film including at least partially a ferroelectric material.

(3)

The semiconductor storage element according to (1) or (2), in which the first transistor and the second transistor are transistors of an identical conductivity type.

(4)

The semiconductor storage element according to (3), in which
each of the first transistor and the second transistor is a transistor of a first conductivity type, and
a channel region in the first transistor includes an impurity of a second conductivity type at a concentration lower than a concentration of the impurity of the second conductivity type included in a channel region in the second transistor, the second conductivity type being a conductivity type opposite to the first conductivity type.

(5)

The semiconductor storage element according any one of (1) to (3), in which
the first transistor is a transistor of a first conductivity type, and
a channel region in the first transistor includes an impurity of the first conductivity type at a concentration lower than a concentration of the impurity of the first conductivity type included in a source/drain region of the first transistor.

(6)

The semiconductor storage element according to any one of (1) to (5), further including a third transistor that is coupled to, at one of a source and a drain, a gate of the first transistor.

(7)

The semiconductor storage element according to (6), in which the third transistor has a gate insulation film that includes at least partially a ferroelectric material.

(8)

A semiconductor storage device, including a plurality of semiconductor storage elements arranged in a matrix,
the plurality of semiconductor storage elements each including a first transistor and a second transistor, the first transistor having a gate insulation film including at least partially a ferroelectric material and being a transistor to which information is written, the second transistor being coupled to, at one of a source and a drain, a source or a drain of the first transistor, the first transistor having a threshold voltage smaller than 0 V when writing information and a threshold voltage smaller than 0 V when erasing information.

(9)

A semiconductor system, including:
a semiconductor storage device; and
an arithmetic device that is coupled to the semiconductor storage device,
the semiconductor storage device and the arithmetic device being mounted on one semiconductor chip,
the semiconductor storage device including a plurality of semiconductor storage elements arranged in a matrix, the plurality of semiconductor storage elements each including a first transistor and a second transistor, the first transistor having a gate insulation film including at least partially a ferroelectric material and being a transistor to which information is written, the second transistor being coupled to, at one of a source and a drain, a source or a drain of the first transistor, the first transistor having a threshold voltage smaller than 0 V when writing information and a threshold voltage smaller than 0 V when erasing information.

(10)

A method of controlling a semiconductor element that is a method of controlling a semiconductor storage element that includes a transistor, the transistor having a gate insulation film that includes at least partially a ferroelectric material and being a transistor to which information is written, the method including:
controlling, when writing and when reading the information, a threshold voltage of the transistor by applying a voltage to a semiconductor substrate on which the semiconductor storage element is provided.

NUMERICAL REFERENCES 1, 1a Semiconductor storage element
10, 10 Semiconductor storage device
20, 20a Semiconductor substrate
22, 24 Activation region
26 Element isolation region
30 Flattening film
40, 50, 60 Interlayer insulation film
42, 62, 64 Wiring layer
52 Contact
110, 110a, 112 Gate electrode
110S, 112S, 220S, 222S, 224S, 226S Contact region
140 First gate insulation film
142 Second gate insulation film
150, 152 Sidewall insulation film
160 Shared contact
220 First source region
222 First drain region
224 Second source/drain region
226 Third source/drain region
230, 300, 302 Contact plug
500 Channel
600 Memory window
610, 620 Band
BL Bit line
BL1 First bit line
BL2 Second bit line
T1, T1a First transistor
T2 Second transistor
T3 Third transistor
Ts Selection transistor
WL Word line
WL1 First word line
WL2 Second word line
Vs Power supply

The invention claimed is:

1. A semiconductor storage element, comprising:
a first transistor that includes:
  a gate insulation film that includes a ferroelectric material, wherein
    information is writable to the first transistor in a writing state of the first transistor, and
    the first transistor is of a first conductivity type; and
  a channel region that includes an impurity of the first conductivity type at a concentration lower than a concentration of the impurity of the first conductivity type in at least one of a source of the first transistor or a drain of the first transistor, wherein
    the first transistor has a threshold voltage smaller than 0 V in each of the writing state of the first transistor and an erasing state of the first transistor, and
    the information is erasable from the first transistor in the erasing state of the first transistor; and
a second transistor, wherein one of a source or a drain of the second transistor is coupled to one of the source or the drain of the first transistor.

2. The semiconductor storage element according to claim 1, wherein the second transistor comprises a gate insulation film that includes the ferroelectric material.

3. The semiconductor storage element according to claim 1, wherein the second transistor is of the first conductivity type.

4. The semiconductor storage element according to claim 1, further comprising a third transistor, wherein one of a source or a drain of the third transistor is coupled to a gate of the first transistor.

5. The semiconductor storage element according to claim 4, wherein the third transistor comprises a gate insulation film that includes the ferroelectric material.

6. A semiconductor storage device, comprising:
a plurality of semiconductor storage elements in a matrix, wherein each semiconductor storage element of the plurality of semiconductor storage elements comprises:
   a first transistor that includes:
      a gate insulation film that includes a ferroelectric material, wherein
         information is writable to the first transistor in a writing state of the first transistor, and
         the first transistor is of a first conductivity type; and
      a channel region that includes an impurity of the first conductivity type at a concentration lower than a concentration of the impurity of the first conductivity type in at least one of a source of the first transistor or a drain of the first transistor, wherein
         the first transistor has a threshold voltage smaller than 0 V in each of the writing state of the first transistor and an erasing state of the first transistor, and
         the information is erasable from the first transistor in the erasing state of the first transistor; and
   a second transistor, wherein one of a source or a drain of the second transistor is coupled to one of the source or the drain of the first transistor.

7. A semiconductor system, comprising:
a semiconductor storage device; and
an arithmetic device coupled to the semiconductor storage device, wherein
   the semiconductor storage device and the arithmetic device are mountable on a semiconductor chip,
   the semiconductor storage device includes a plurality of semiconductor storage elements in a matrix, and
   each semiconductor storage element of the plurality of semiconductor storage elements comprises:
      a first transistor that includes:
         a gate insulation film that includes a ferroelectric material, wherein
            information is writable to the first transistor in a writing state of the first transistor, and
            the first transistor is of a first conductivity type; and
         a channel region that includes an impurity of the first conductivity type at a concentration lower than a concentration of the impurity of the first conductivity type in at least one of a source of the first transistor or a drain of the first transistor, wherein
            the first transistor has a threshold voltage smaller than 0 V in each of the writing state of the first transistor and an erasing state of the first transistor, and
            the information is erasable from the first transistor in the erasing state of the first transistor; and
      a second transistor, wherein one of a source or a drain of the second transistor is coupled to one of the source or the drain of the first transistor.

8. A semiconductor storage element, comprising
a first transistor that includes:
   a gate insulation film that includes a ferroelectric material, wherein
      information is writable to the first transistor in a writing state of the first transistor,
      the first transistor is of a first conductivity type; and
   a channel region that includes an impurity of a second conductivity type, wherein
      the first transistor has a threshold voltage smaller than 0 V in each of the writing state of the first transistor and an erasing state of the first transistor, and
      the information is erasable from the first transistor in the erasing state of the first transistor; and
a second transistor that includes a channel region, wherein
   the channel region of the second transistor includes the impurity of the second conductivity type,
   one of a source or a drain of the second transistor is coupled to one of a source or a drain of the first transistor,
   the second transistor is of the first conductivity type,
   the impurity of the second conductivity type in the channel region of the first transistor is at a concentration lower than a concentration of the impurity of the second conductivity type in the channel region of the second transistor, and
the first conductivity type is different from the second conductivity type.

* * * * *